(12) United States Patent
Jeon et al.

(10) Patent No.: US 12,108,634 B2
(45) Date of Patent: Oct. 1, 2024

(54) DISPLAY DEVICE AND METHOD OF FABRICATING THE SAME

(71) Applicant: Samsung Display Co., Ltd., Yongin-si (KR)

(72) Inventors: Hyung Il Jeon, Yongin-si (KR); Min Woo Kim, Yongin-si (KR); Dae Ho Song, Yongin-si (KR); Byung Choon Yang, Yongin-si (KR); Jin Woo Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 658 days.

(21) Appl. No.: 17/220,621

(22) Filed: Apr. 1, 2021

(65) Prior Publication Data

US 2022/0020831 A1 Jan. 20, 2022

(30) Foreign Application Priority Data

Jul. 17, 2020 (KR) .................... 10-2020-0089069

(51) Int. Cl.
*H10K 59/124* (2023.01)
*H10K 50/86* (2023.01)
(Continued)

(52) U.S. Cl.
CPC ......... *H10K 59/124* (2023.02); *H10K 50/865* (2023.02); *H10K 59/38* (2023.02); *H10K 71/00* (2023.02)

(58) Field of Classification Search
CPC .... H10K 59/124; H10K 50/865; H10K 59/38; H10K 71/00; H10K 59/122; H10K 50/84; H10K 59/131; H10K 59/12; H01L 33/62; H01L 25/167; H01L 33/0095; H01L 25/0753; H01L 27/124; H01L 27/1218;
(Continued)

(56) References Cited

U.S. PATENT DOCUMENTS 6,897,855 B1 5/2005 Matthies et al.
9,343,448 B2 5/2016 Sakariya et al.
(Continued)

FOREIGN PATENT DOCUMENTS

JP 2015-194515 A 11/2015
KR 10-0570507 B1 9/2006
(Continued)

*Primary Examiner* — Kevin Quarterman
(74) *Attorney, Agent, or Firm* — Lewis Roca Rothgerber Christie LLP

(57) ABSTRACT

A display device, includes: a substrate including a plurality of pixel areas each having an emission area; and a pixel provided in each of the pixel areas, wherein the pixel comprises: at least one light emitting element on a first surface of the substrate; a first insulating layer on the light emitting element; at least one transistor on the first insulating layer and electrically connected to the light emitting element; a second insulating layer on the transistor; a common electrode on the second insulating layer; and a pixel electrode on a third insulating layer of the common electrode and electrically connected to the transistor, wherein the light emitting element comprises a semiconductor structure on the substrate, and first and second electrodes on the semiconductor structure to be spaced apart from each other.

17 Claims, 22 Drawing Sheets

(51) Int. Cl.
*H10K 59/38* (2023.01)
*H10K 71/00* (2023.01)

(58) Field of Classification Search
CPC .. H01L 27/1259; H01L 27/156; G09G 3/3208
See application file for complete search history.

(56) References Cited

U.S. PATENT DOCUMENTS

| | | | |
|---|---|---|---|
| 9,367,094 | B2 | 6/2016 | Bibl et al. |
| 9,709,838 | B2 | 7/2017 | Jung et al. |
| 10,410,998 | B2 | 9/2019 | Kim et al. |
| 10,446,719 | B2 | 10/2019 | Bower et al. |
| 10,546,516 | B2 | 1/2020 | Tomoda et al. |
| 10,629,577 | B2 | 4/2020 | Tao et al. |
| 10,636,349 | B2 | 4/2020 | Shin et al. |
| 2019/0181301 | A1* | 6/2019 | Kim ........................ H01L 33/44 |
| 2020/0075667 | A1* | 3/2020 | Lee ......................... H01L 33/44 |
| 2020/0083309 | A1* | 3/2020 | Wang .................... H10K 59/126 |
| 2020/0185379 | A1* | 6/2020 | Matsukizono .... H01L 29/78645 |
| 2020/0273397 | A1* | 8/2020 | Jeong ...................... H01L 33/62 |
| 2020/0285090 | A1* | 9/2020 | Tanaka ................... H10K 50/81 |
| 2020/0350308 | A1* | 11/2020 | Yamazaki ........... H01L 29/7869 |
| 2021/0391309 | A1* | 12/2021 | Kim ...................... H01L 33/504 |

FOREIGN PATENT DOCUMENTS

| | | |
|---|---|---|
| KR | 10-2018-0073971 A | 7/2018 |
| KR | 10-2133914 B1 | 7/2020 |

\* cited by examiner

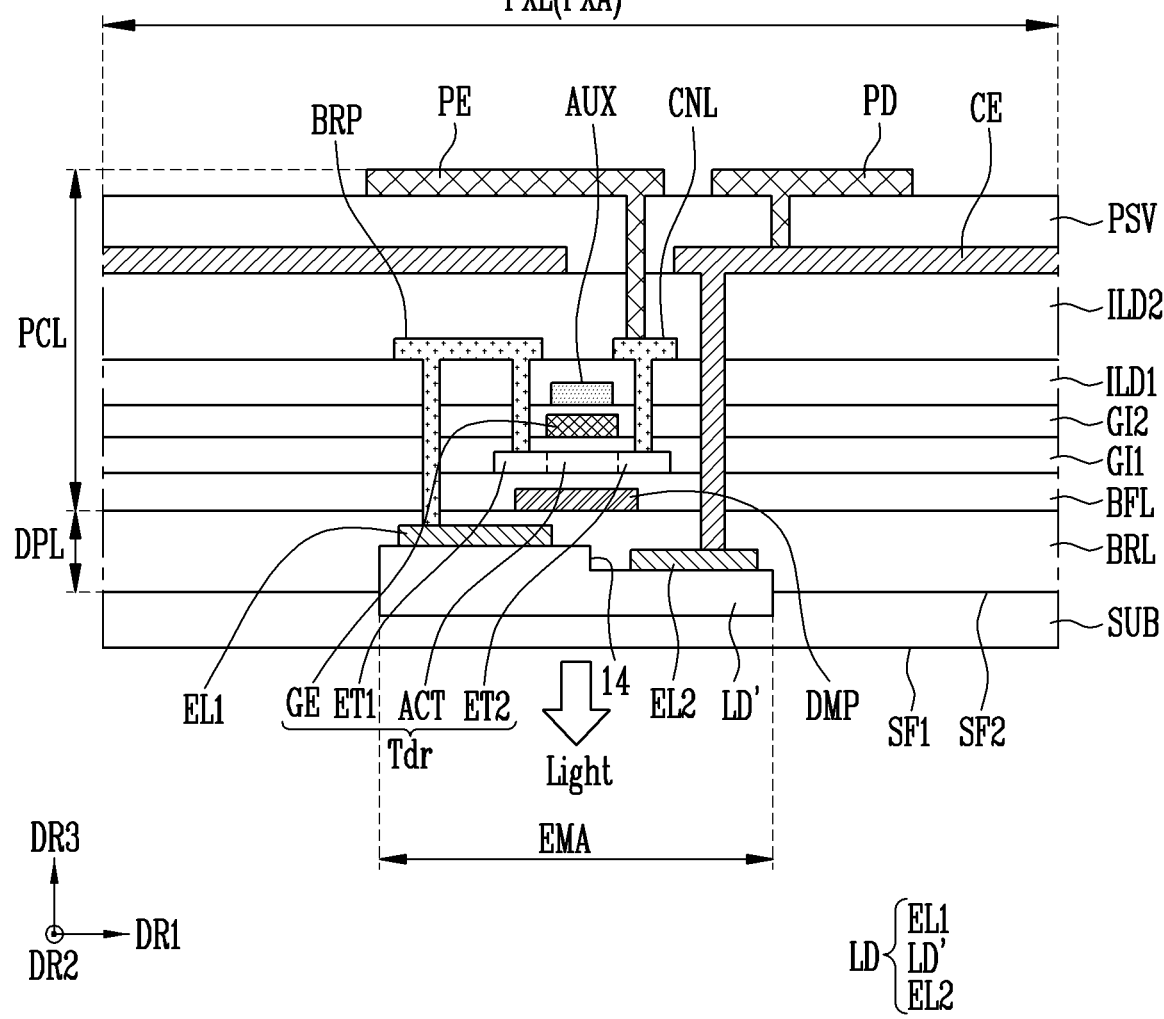

FIG. 8A
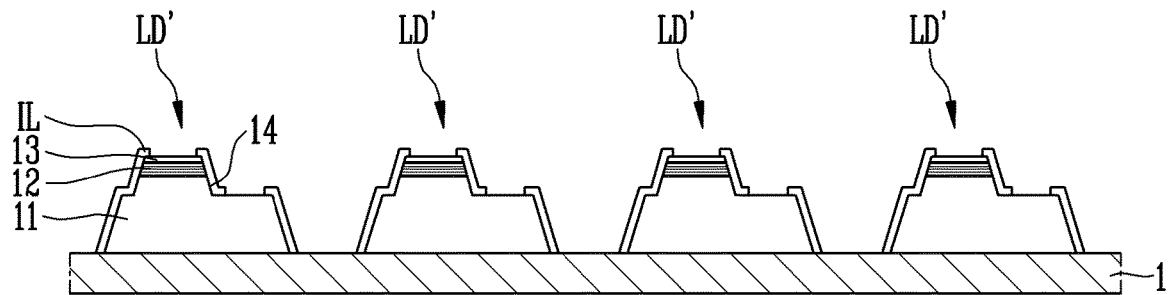
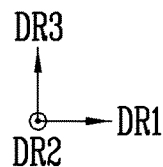
FIG. 8B
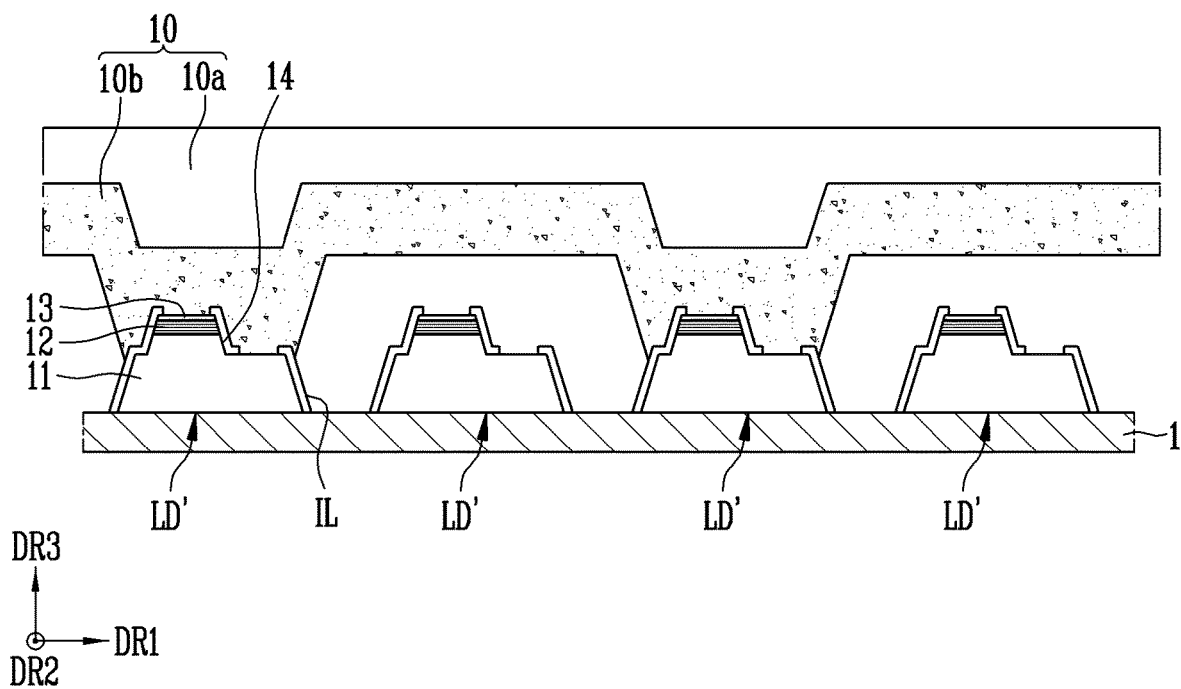

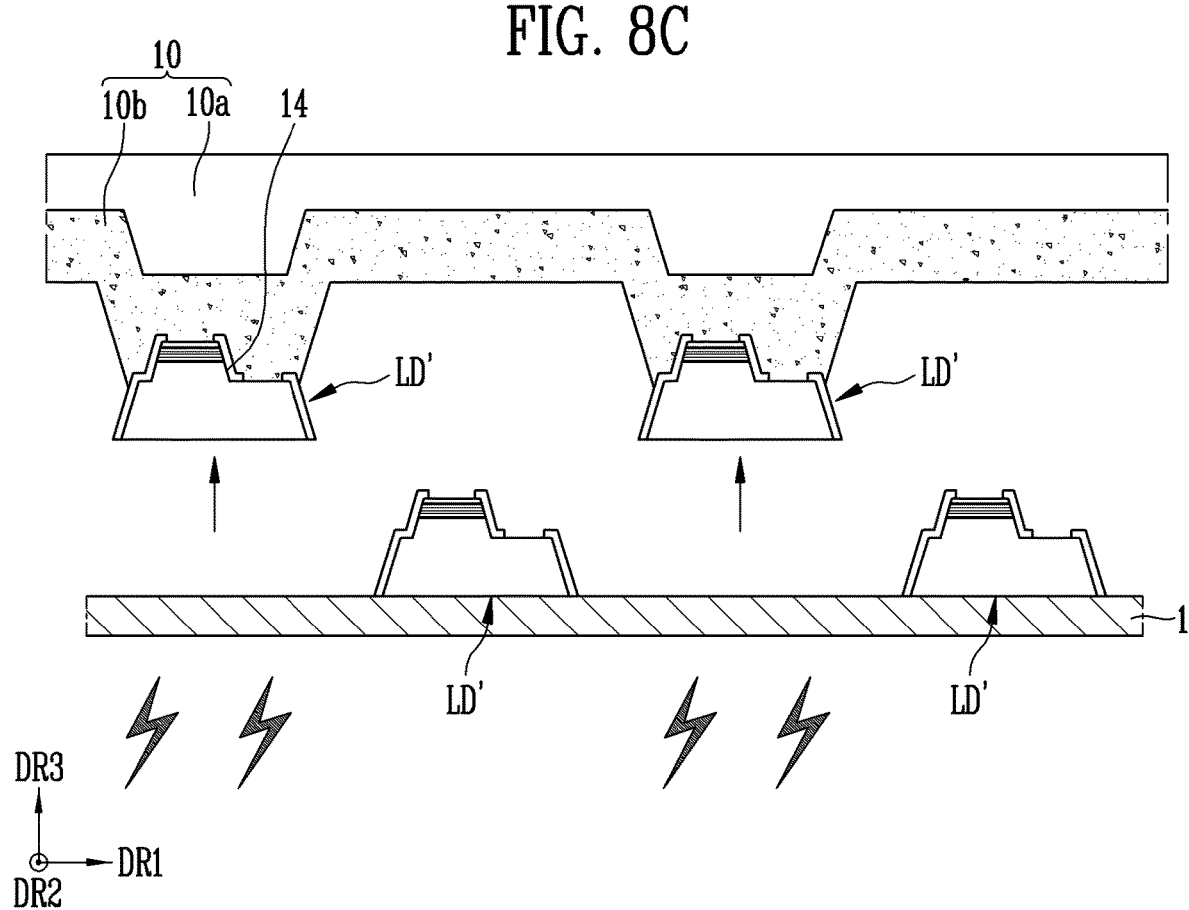

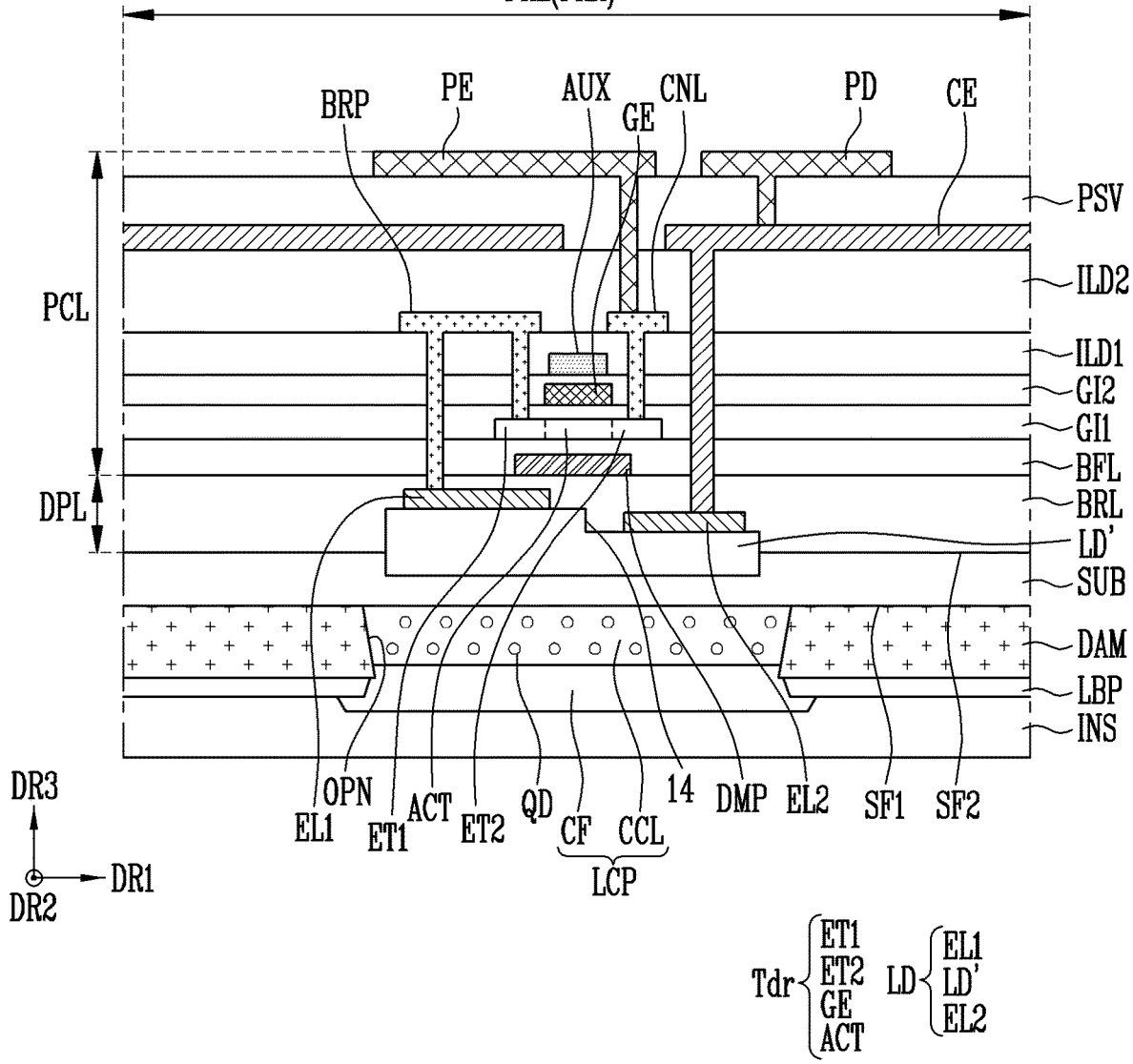

DISPLAY DEVICE AND METHOD OF FABRICATING THE SAME

CROSS-REFERENCE TO RELATED APPLICATION

The present application claims priority to and the benefit of Korean patent application number 10-2020-0089069 filed in the Korean Intellectual Property Office on Jul. 17, 2020, the entire disclosure of which is incorporated herein in its entirety by reference.

BACKGROUND

1. Field

Aspects of some example embodiments of the present disclosure relate to a display device having a light emitting element and a method of fabricating the same.

2. Description of Related Art

With an increase in interest in an information display and an increase in demand to use portable information media, demand for display devices is markedly increased, and commercialization thereof is in progress.

The above information disclosed in this Background section is only for enhancement of understanding of the background and therefore the information discussed in this Background section does not necessarily constitute prior art.

SUMMARY

Aspects of some example embodiments of the present disclosure are directed to a display device capable of improving reliability and a method of fabricating the same.

According to some example embodiments of the present disclosure, a display device includes: a substrate including a plurality of pixel areas each having an emission area; and a pixel provided in each of the pixel areas. The pixel may include at least one light emitting element located on a first surface of the substrate; a first insulating layer on the light emitting element; at least one transistor on the first insulating layer and electrically connected to the light emitting element; a second insulating layer on the transistor; a common electrode on the second insulating layer; and a pixel electrode on a third insulating layer of the common electrode and electrically connected to the transistor. The light emitting element may include a semiconductor structure on the substrate, and first and second electrodes on the semiconductor structure to be spaced apart from each other.

According to some example embodiments, the semiconductor structure may include a first semiconductor layer, an active layer on the first semiconductor layer, and a second semiconductor layer on the active layer. The first electrode may be electrically connected to one of the first and second semiconductor layers, and the second electrode may be electrically connected to a remaining one of the first and second semiconductor layers.

According to some example embodiments, the first electrode may be positioned between the one semiconductor layer and the first insulating layer, when viewed from a cross-section. Furthermore, the second electrode may be positioned between the remaining semiconductor layer and the first insulating layer, when viewed from the cross-section.

According to some example embodiments, the semiconductor structure may include a mesa interface.

According to some example embodiments, the pixel may further include a contact line electrically connecting the pixel electrode and the transistor; and a bridge pattern electrically connecting the transistor and the first electrode.

According to some example embodiments, the contact line and the bridge pattern may be provided on the same layer, and may include the same material.

According to some example embodiments, the common electrode may be on each of the contact line and the bridge pattern with the second insulating layer being interposed therebetween.

According to some example embodiments, the common electrode may be electrically connected to the second electrode.

According to some example embodiments, the pixel may further include at least one pad electrode electrically spaced apart from the pixel electrode on the third insulating layer and electrically connected to the common electrode and the second electrode.

According to some example embodiments, the display device may further include an optical conversion pattern layer on a second surface of the substrate to correspond to the emission area; and a light shielding pattern on a second surface of the substrate to correspond to a periphery of the emission area. Here, the light shielding pattern may be a black matrix.

According to some example embodiments, the display device may further include a base layer on the second surface of the substrate and having an opening corresponding to the emission area. Here, the optical conversion pattern layer may be positioned in the opening.

According to some example embodiments, the optical conversion pattern layer may include a color conversion layer on the second surface of the substrate in the opening and including color conversion particles; and a color filter pattern on the color conversion layer.

According to some example embodiments, the light shielding pattern may be on the base layer and may not overlap the opening.

According to some example embodiments, the display device may further include a dam structure on the second surface of the substrate and defining an opening that overlaps the light emitting element. Here, the optical conversion pattern layer may be positioned in the opening.

According to some example embodiments, the light shielding pattern may be positioned on the dam structure.

According to some example embodiments, the display device may further include a reflective member between the light emitting element and the transistor, when viewed from the cross-section.

According to some example embodiments of the present disclosure, in a method of fabricating a display device, the method includes: providing a substrate on a base layer; arranging a transfer base substrate to which at least one semiconductor structure is transferred on the substrate, thus re-transferring the semiconductor structure onto the substrate; curing the substrate, and then separating the transfer base substrate; forming first and second electrodes on the semiconductor structure to be spaced apart from each other; forming a first insulating layer on the first and second electrodes; forming at least one transistor on the first insulating layer; forming a common electrode electrically connected to the second electrode on the second insulating layer of the transistor; and forming a pixel electrode electrically connected to the first electrode and the transistor on a third insulating layer of the common electrode. Here, the semiconductor structure and the first and second electrodes may constitute a light emitting element.

BRIEF DESCRIPTION OF THE DRAWINGS

FIGS. 4A to 4C schematically illustrate a pixel in according to some example embodiments of the present disclosure, and are schematic cross-sectional views illustrating a coupling structure between a driving transistor and a light emitting element shown in FIG. 3.

FIGS. 8A to 8E are schematic cross-sectional views sequentially illustrating a transfer method of a semiconductor structure in according to some example embodiments of the present disclosure.

FIGS. 9 and 10 are cross-sectional views schematically illustrating a pixel in according to some example embodiments of the present disclosure.

DETAILED DESCRIPTION

Figure 1:
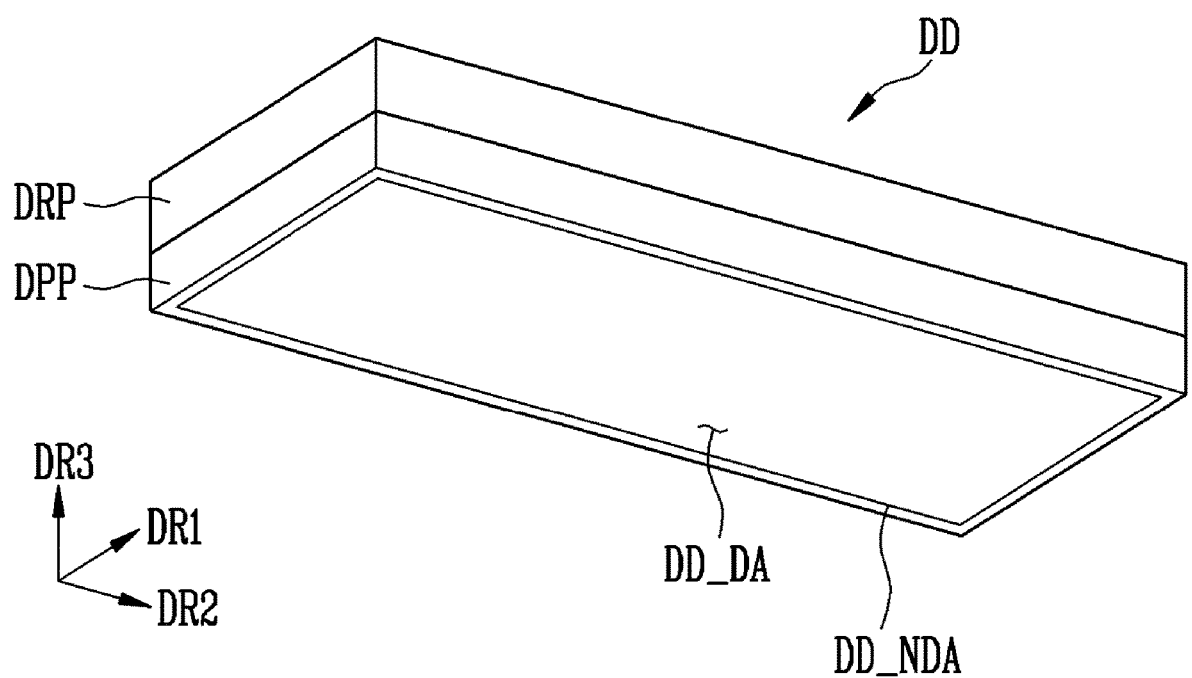
FIG. 1 is a rear perspective view schematically illustrating a display device according to some example embodiments of the present disclosure.

As the present disclosure allows for various changes and numerous embodiments, aspects of some example embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure.

Throughout the disclosure, like reference numerals refer to like parts throughout the various figures and embodiments of the present disclosure. The sizes of elements in the accompanying drawings may be exaggerated for clarity of illustration. It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element. In the present disclosure, the singular forms are intended to include the plural forms as well, unless the context clearly indicates otherwise.

It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first part such as a layer, a film, a region, or a plate is located on a second part, the first part may be not only directly on the second part but a third part may intervene between them. In addition, when it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, when a first part such as a layer, a film, a region, or a plate is under a second part, the first part may be not only directly under the second part but a third part may intervene between them.

Herein, it will be understood that when an element (e.g., a first element) is referred to as being (operatively or communicatively) "coupled with/to," or "connected with/to" another element (e.g., a second element), the first element can be coupled or connected with/to the second element directly or via another element (e.g., a third element). In contrast, it will be understood that when an element (e.g., a first element) is referred to as being "directly coupled with/to" or "directly connected with/to" another element (e.g., a second element), no other element (e.g., a third element) intervenes between the element and the other element.

Aspects and characteristics of embodiments according to the present disclosure are described with reference to the accompanying drawings in order to describe the present disclosure in detail so that those having ordinary knowledge in the technical field to which the present disclosure pertains can easily practice the present disclosure. Furthermore, a singular form may include a plural from as long as it is not specifically mentioned in a sentence.

Figure 2:
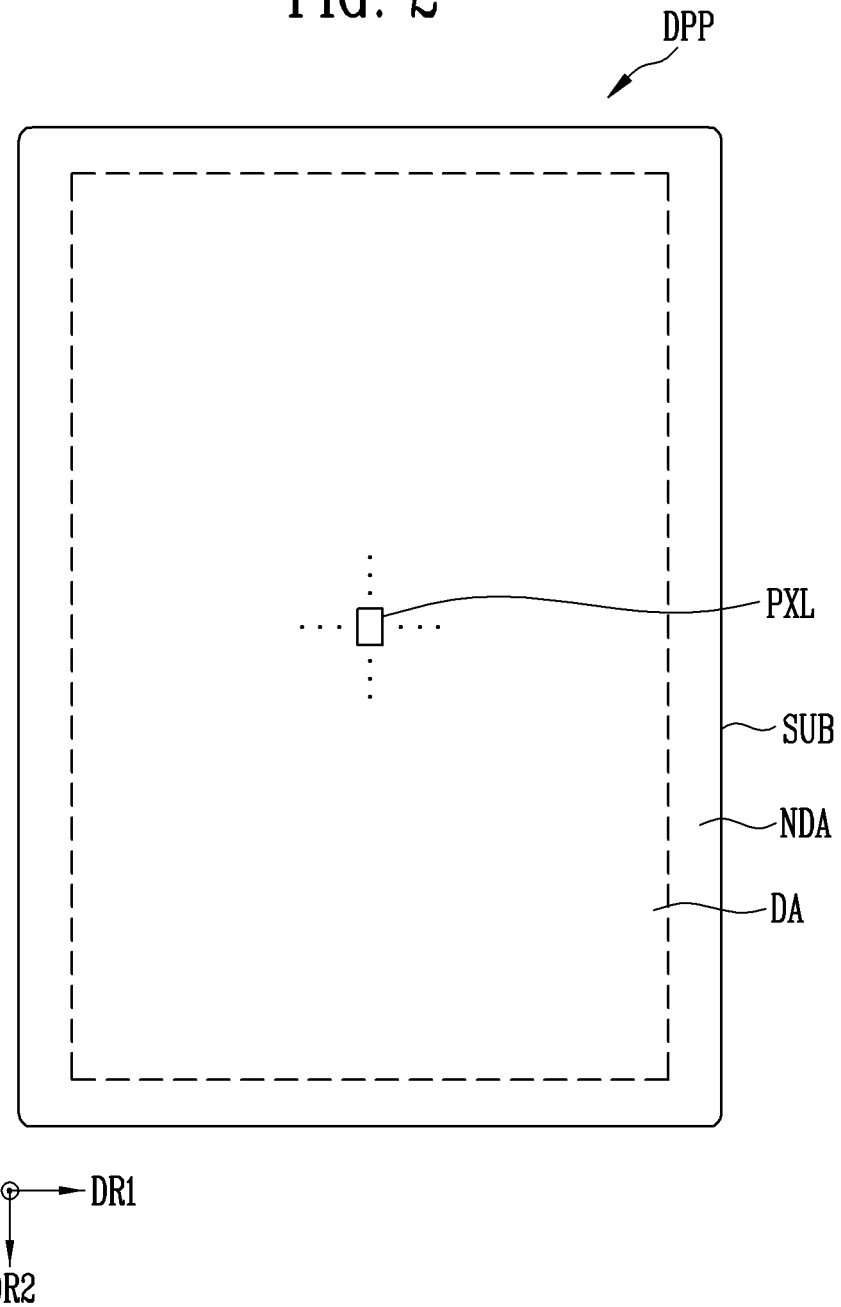
FIG. 2 is a schematic plan view of a display panel of FIG. 1.

FIG. 1 is a rear perspective view schematically illustrating a display device in according to some example embodiments of the present disclosure, and FIG. 2 is a schematic plan view of a display panel of FIG. 1.

Referring to FIGS. 1 and 2, the display device DD may include a display component DPP and a driver DRP.

As long as the display device DD is an electronic device having on a surface thereof a display surface, such as a smart phone, a television, a tablet PC, a mobile phone, a video phone, an e-book reader, a desktop PC, a laptop PC, a netbook computer, a workstation, a server, a PDA, a portable multimedia player (PMP), an MP3 player, a medical device, a camera, or a wearable device, embodiments according to the present disclosure may be applied thereto.

The display device DD may be provided in various forms, for example, in the form of a rectangular plate having two pairs of parallel sides. However, embodiments according to the present disclosure are not limited thereto. In the case where the display device DD is provided in the form of a rectangular plate, one pair of sides of the two pairs of sides may be longer than the other. In the drawings, the display device DD is illustrated as having angled corners of straight lines, but embodiments according to the present disclosure are not limited thereto. According to some example embodiments, in the display device DD provided in the shape of a rectangular plate, a corner portion where one long side and one short side meets may have a round shape.

According to some example embodiments of the present disclosure, for the sake of explanation, there is illustrated an example in which the display device DD has a rectangular form with a pair of long sides and a pair of short sides. The direction in which the long sides extend refers to a second direction DR2, the direction in which the short sides extend refers to a first direction DR1, and the direction perpendicular to the long sides and the short sides refers to a third direction DR3. The first to third directions DR1, DR2, and DR3 may refer to the directions indicated by the first to third directions DR1, DR2, and DR3, respectively.

According to some example embodiments of the present disclosure, at least portion of the display device DD may have flexibility, and the display device may fold at the portion having the flexibility.

The display device DD may include a display area DD_DA provided to display an image, and a non-display area DD_NDA provided on at least one side of the display area DD_DA. The non-display area DD_NDA may be an area on which an image is not displayed. However, embodiments according to the present disclosure are not limited to this. According to some example embodiments, the shape of the display area DD_DA and the shape of the non-display area DD_NDA may be relatively designed.

According to some example embodiments, the display device DD may include a sensing area and a non-sensing area. The display device DD may not only display an image through the sensing area, but also sense a touch input made on the display surface or sense light incident from the front. The non-sensing area may enclose the sensing area, but this is illustrative. Embodiments according to the present disclosure are not limited thereto. According to some example embodiments, a portion of the display area DA may correspond to the sensing area.

The display component DPP may display an image. A self-emissive display panel, such as an organic light emitting display (OLED) panel using an organic light emitting diode as the light emitting element, a nano-scale LED display panel using a nano-scale light emitting diode as the light emitting element, or a quantum dot organic light emitting display (QD OLED) panel using a quantum dot and an organic light emitting diode, may be used as the display component DPP. In addition, a non-emissive display panel such as a liquid crystal display (LCD) panel, an electrophoretic display (EPD) panel, or an electrowetting display (EWD) panel may be used as the display component DPP. In the case where the non-emissive display panel is used as the display component DPP, the display device DD may include a backlight unit configured to supply light to the display component DPP.

The display component DPP may include a substrate SUB and a plurality of pixels PXL provided on the substrate SUB.

The substrate SUB may be formed of one area having an approximately rectangular shape. However, the number of areas provided on the substrate SUB may vary, and the substrate SUB may have a different shape depending on the area provided on the substrate SUB.

The substrate SUB may be made of insulating material such as glass or resin. Furthermore, the substrate SUB may be made of material having flexibility so as to be bendable or foldable, and have a single- or multi-layer structure. For instance, examples of the material having flexibility may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, or cellulose acetate propionate. According to some example embodiments of the present disclosure, the substrate SUB may be made of polyimide having flexibility. However, material forming the substrate SUB is not limited to the above-described example embodiments.

The substrate SUB may include a display area DA and a non-display area NDA. The display area DA may be an area where the pixels PXL are provided to display an image, and the non-display area NDA may be an area where the pixels PXL are not provided and thus an image is not displayed. For the convenience of description, only one pixel PXL is illustrated in FIG. 2, but substantially a plurality of pixels PXL may be located in the display area DA of the substrate SUB.

The display area DA of the display component DPP may correspond to the display area DD_DA of the display device DD. The non-display area NDA of the display component DPP may correspond to the non-display area DD_NDA of the display device DD.

The pixels PXL may be located in the display area DA of the substrate SUB. Each of the pixels PXL may be a minimum unit for displaying an image. The pixels PXL each may include a light emitting element which emits white light and/or color light. Each of the pixels PXL may emit any one color of red, green and blue, but embodiments according to the present disclosure are not limited to this, and the pixel PXL may emit a color such as cyan, magenta or yellow. Each of the pixels PXL may include at least one light-emitting element that emits light. A detailed description of the light emitting element will be described below with reference to FIGS. 5A and 5B.

The pixels PXL may be arranged in a matrix form along rows extending in a first direction DR1 and columns extending in a second direction DR2 intersecting with the first direction DR1. However, the arrangement of the pixels PXL is not limited to a particular arrangement. In other words, the pixels PXL may be arranged in various forms. In the drawing, although the pixels PXL each have been illustrated as having a rectangular shape, embodiments according to the present disclosure are not limited to this. The pixel PXL may have various shapes. Furthermore, when a plurality of pixels PXL is provided, they may have different areas (or sizes). For example, in the case of pixels PXL having different colors of emitted light, the pixels PXL may be provided in different areas (or sizes) or in different shapes for each color.

A line component electrically connected to the pixels PXL may be located in the non-display area NDA of the substrate SUB. The line component may electrically connect a driver DRP with the pixels PXL. The line component may be a fan-out line that provides a signal to each pixel PXL and is connected to signal lines connected to each pixel PXL, for instance, a scan line, a data line, an emission control line or the like. Furthermore, the line component may be a fan-out line connected to signal lines connected to each pixel PXL, for instance, a control line, a sensing line or the like so as to compensate for changes in electrical characteristics of each pixel PXL in real time.

The driver DRP may be provided on the display component DPP, and may be electrically connected to the pixels PXL through the above-described line component. The driver DRP may include a printed circuit board on which a drive chip electrically connected to the light emitting element provided on each pixel PXL is mounted, and a heat dissipation layer which is positioned on the printed circuit board and dissipates heat generated from the driver DRP to an outside. However, the configuration of the driver DRP is not limited to the above-described embodiments.

The structure of each pixel PXL and the light emitting element will be described in more detail with reference to FIGS. 4A to 6B.

Figure 3:
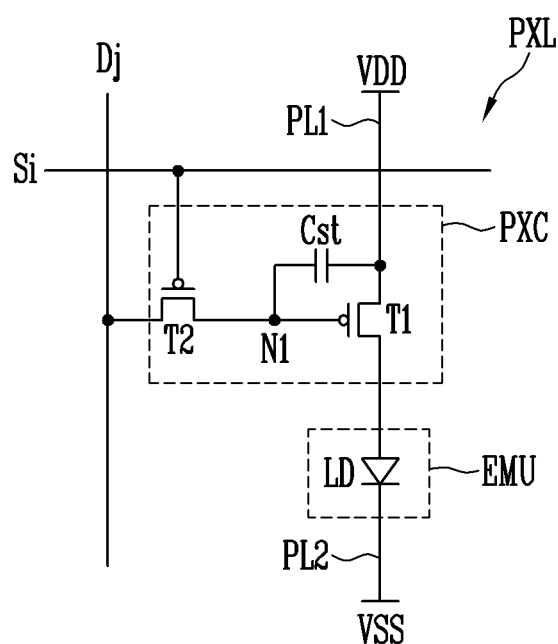
FIG. 3 is a circuit diagram illustrating an electrical coupling relationship of components included in one pixel shown in FIG. 2, according to some example embodiments.

FIG. 3 is a circuit diagram illustrating an electrical coupling relationship of components included in one pixel shown in FIG. 2, according to some example embodiments.

For example, FIG. 3 illustrates different embodiments of the electrical coupling relationship of components included in a pixel PXL which may be employed in an active display device. However, the types of the components included in the pixel PXL to which embodiments of the present disclosure may be applied are not limited thereto.

In FIG. 3, not only the components included in each of the pixels illustrated in FIG. 2 but also an area in which the components are provided are embraced in the definition of the term "pixel PXL". According to some example embodiments, each pixel PXL illustrated in FIG. 3 may be any one of the pixels PXL provided on the display component DPP of FIG. 2. The pixels PXL may have substantially the same or similar structure.

Referring to FIGS. 2 and 3, one pixel PXL may include an emission unit EMU that generates light with luminance corresponding to the data signal. The pixel PXL may selectively further include a pixel circuit PXC configured to drive the emission unit EMU.

According to some example embodiments, the emission unit EMU may include at least one light emitting element LD coupled in parallel between a first power supply line PL1 to which the voltage of a first driving power supply VDD is applied and a second power supply line PL2 to which the voltage of a second driving power supply VSS is applied. For instance, the emission unit EMU may include a first electrode connected to the first driving power supply VDD via the pixel circuit PXC and the first power supply line PL1, a second electrode connected to the second driving power supply VSS via the second power supply line PL2, and a light emitting element LD connected between the first electrode and the second electrode. According to some example embodiments, the first electrode may be an anode electrode, and the second electrode may be a cathode electrode.

According to some example embodiments, the light emitting element LD included in the emission unit EMU may include a first side coupled to the first driving power supply VD and a second side coupled to the second driving power supply VSS. The first driving power supply VDD and the second driving power supply VSS may have different potentials. Here, a difference in potential between the first and second driving power supplies VDD and VSS may be set to a value equal to or greater than a threshold voltage of the light emitting element LD during an emission period of the pixel PX.

As described above, the light emitting element LD may constitute an effective light source of the emission unit EMU.

The light emitting element LD may emit light having a luminance corresponding to driving current supplied thereto through the corresponding pixel circuit PXC. For example, during each frame period, the pixel circuit PXC may supply driving current corresponding to a gray scale of corresponding frame data to the emission unit EMU. The driving current supplied to the emission unit EMU may flow into the light emitting element LD. Hence, the light emitting element LD may emit light having a luminance corresponding to the driving current, so that the emission unit EMU may emit light.

The pixel circuit PXC may be connected to a scan line Si and a data line Dj of the pixel PXL. For example, if the pixel PXL is located on an i-th row (i is a natural number) and a j-th column (j is a natural number) of the display area DA, the pixel circuit PXC of the pixel PXL may be connected to an i-th scan line Si and a j-th data line Dj of the display area DA. According to some example embodiments, the pixel circuit PXC may include a first transistor T1, a second transistor T2, and a storage capacitor Cst. The structure of the pixel circuit PXC is not limited to the embodiments illustrated in FIG. 3.

The pixel circuit PXC may include a first transistor T1, a second transistor T2, and a storage capacitor Cst.

A first terminal of the second transistor (switching transistor) T2 may be connected to the j-th data line Dj, and a second terminal thereof may be connected to a first node N1. Here, the first terminal and the second terminal of the second transistor T2 are different from each other, and, for example, if the first terminal is a source electrode, the second terminal may be a drain electrode. A gate electrode of the second transistor T2 may be connected to the i-th scan line Si.

When a scan signal having a voltage (e.g., a low-level voltage) capable of turning on the second transistor T2 is supplied from the i-th scan line Si, the second transistor T2 is turned on to electrically connect the j-th data line Dj with the first node N1. Here, a data signal of a corresponding frame is supplied to the j-th data line Dj, whereby the data signal is transmitted to the first node N1. The data signal transmitted to the first node N1 is charged in the storage capacitor Cst.

The first transistor (driving transistor) T1 may include a first terminal coupled to the first driving power supply VDD, and a second terminal electrically connected to the light emitting element LD. A gate electrode of the first transistor T1 may be coupled to the first node N1. As such, the first transistor T1 may control the amount of driving current to be supplied to the light emitting element LD in response to the voltage of the first node N1.

The storage capacitor Cst may include a first electrode coupled to the first driving power supply VDD, and a second electrode coupled to the first node N1. The storage capacitor Cst charges a voltage corresponding to the data signal supplied to the first node N1, and maintains the charged voltage until a data signal of a subsequent frame is supplied.

FIG. 3 illustrates the pixel circuit PXC including the second transistor T2 configured to transmit the data signal to the pixel PXL, the storage capacitor Cst configured to store the data signal, and the first transistor T1 configured to supply driving current corresponding to the data signal to the light emitting element LD.

However, embodiments according to the present disclosure are not limited thereto, and the structure of the pixel circuit PXC may be changed in various ways. For example, the pixel circuit PXC may further include at least one transistor element such as a transistor element configured to compensate for the threshold voltage of the first transistor T1, a transistor element configured to initialize the first node N1, and/or a transistor element configured to control an emission time of the light emitting elements LD, or other circuit elements such as a boosting capacitor for boosting the voltage of the first node N1.

Figure 4B:
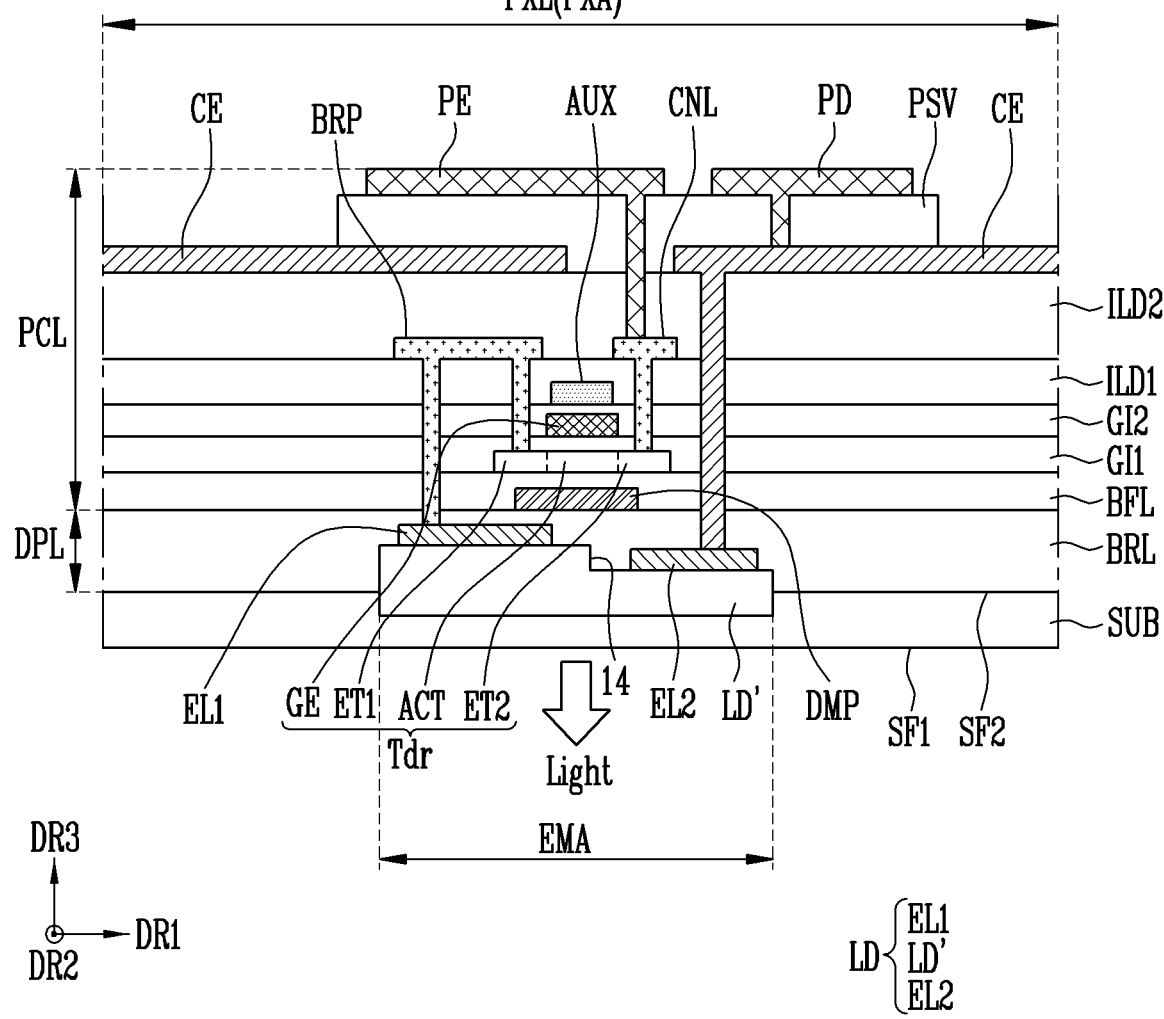
Figure 4C:
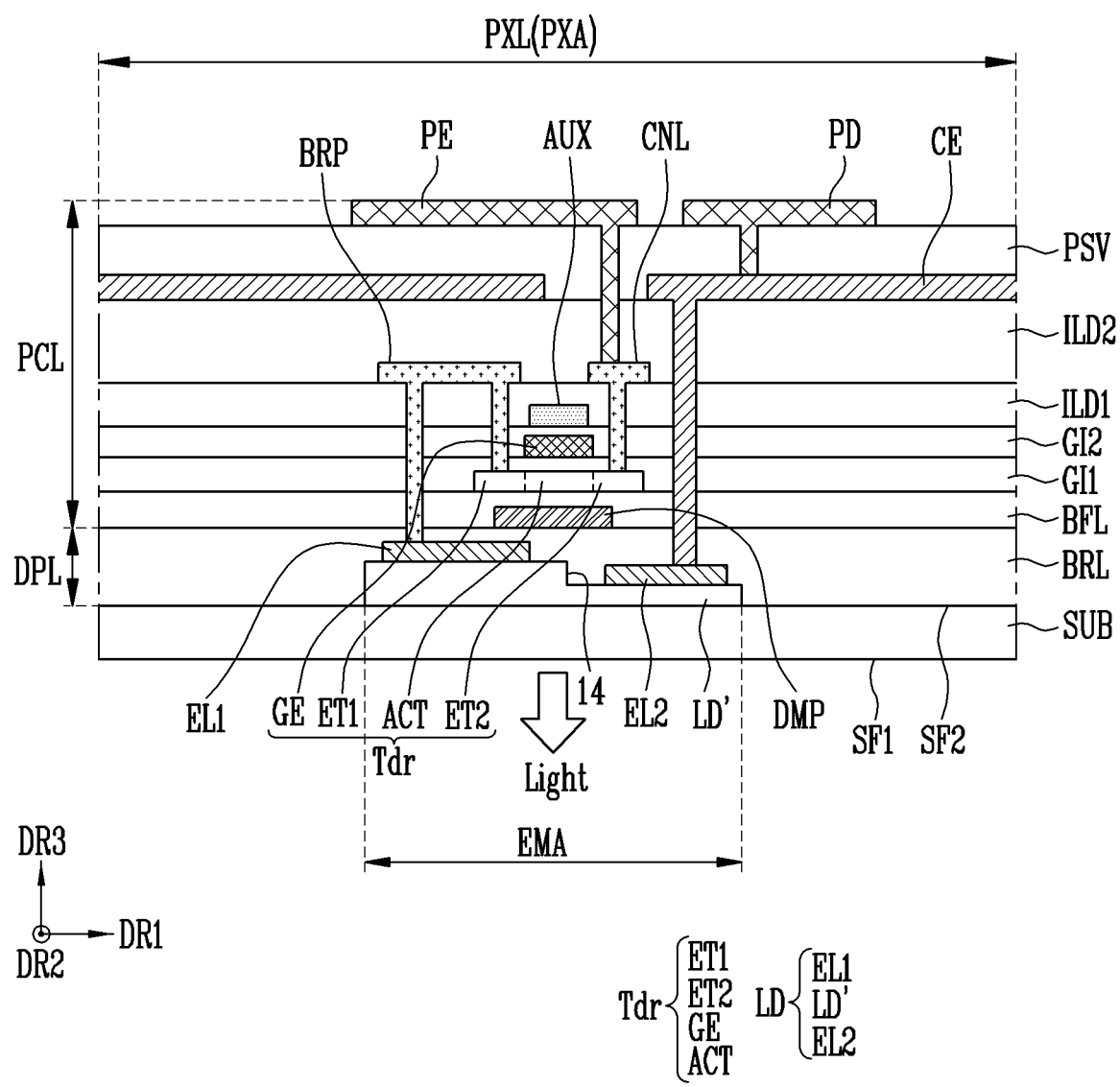
Figure 5A:
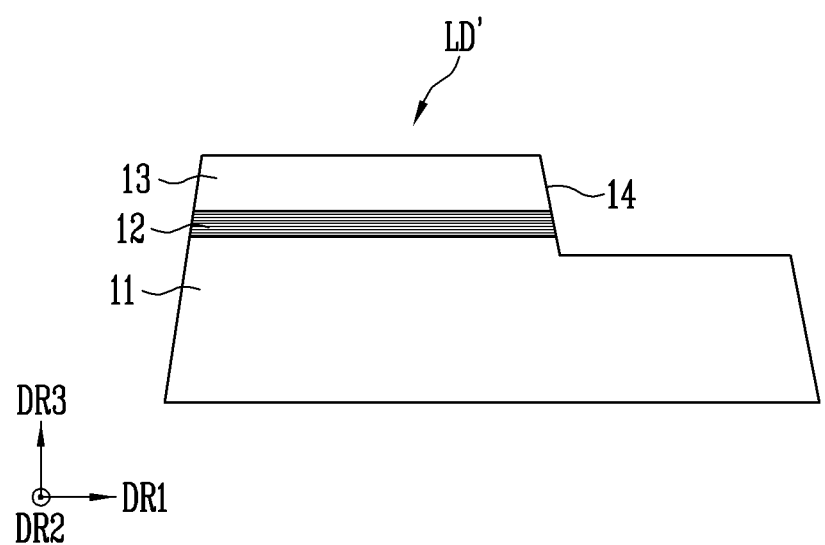
FIG. 5A is a side sectional view schematically illustrating a semiconductor structure of FIG. 4A.
Figure 5B:
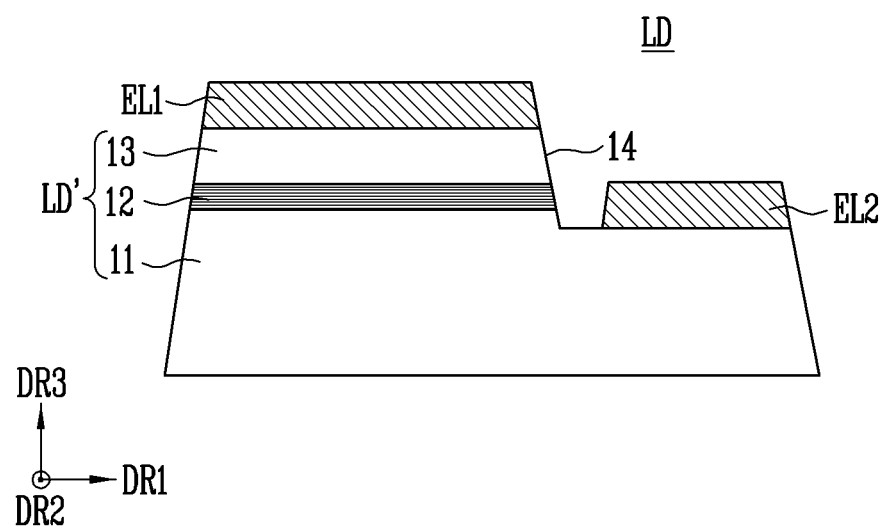
FIG. 5B is a side sectional view schematically illustrating a light emitting element of FIG. 4A according to some example embodiments.
Figure 6A:
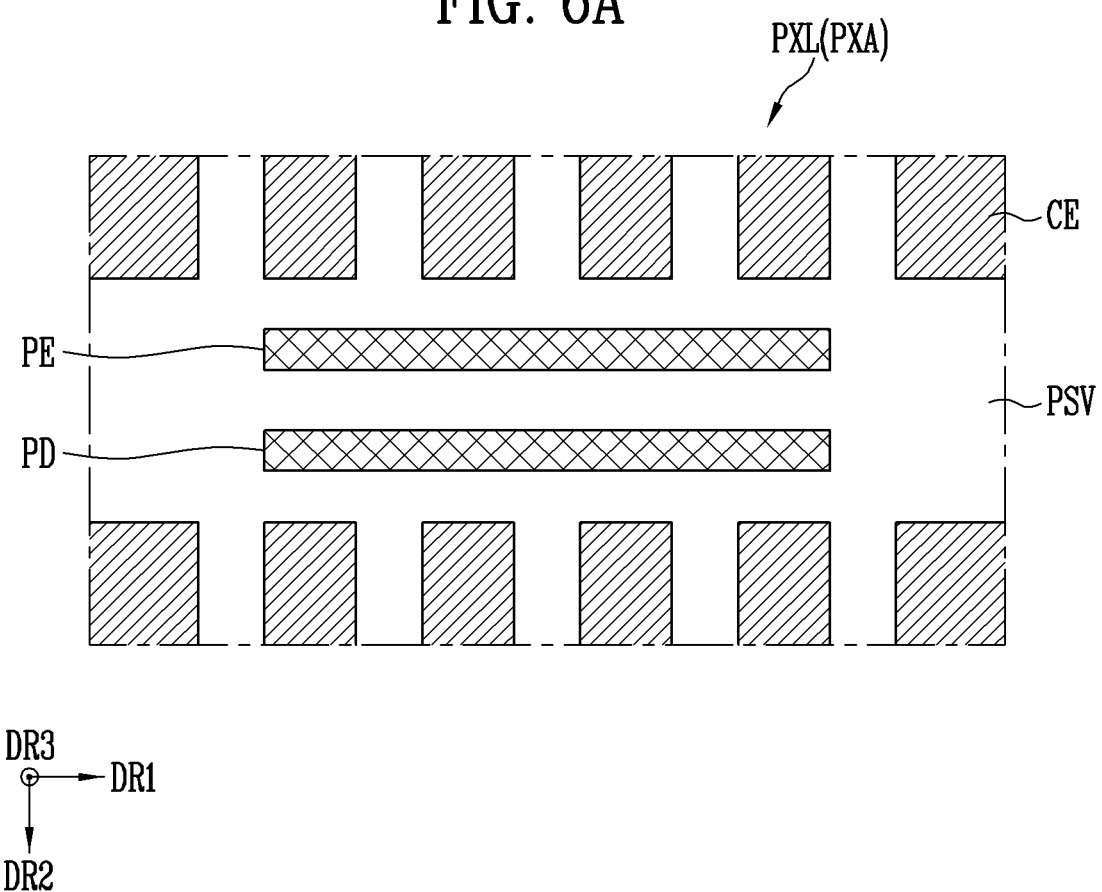
FIG. 6A is a plan view schematically illustrating a pixel based on a pixel electrode and a pad electrode of FIG. 4A according to some example embodiments.
Figure 6B:
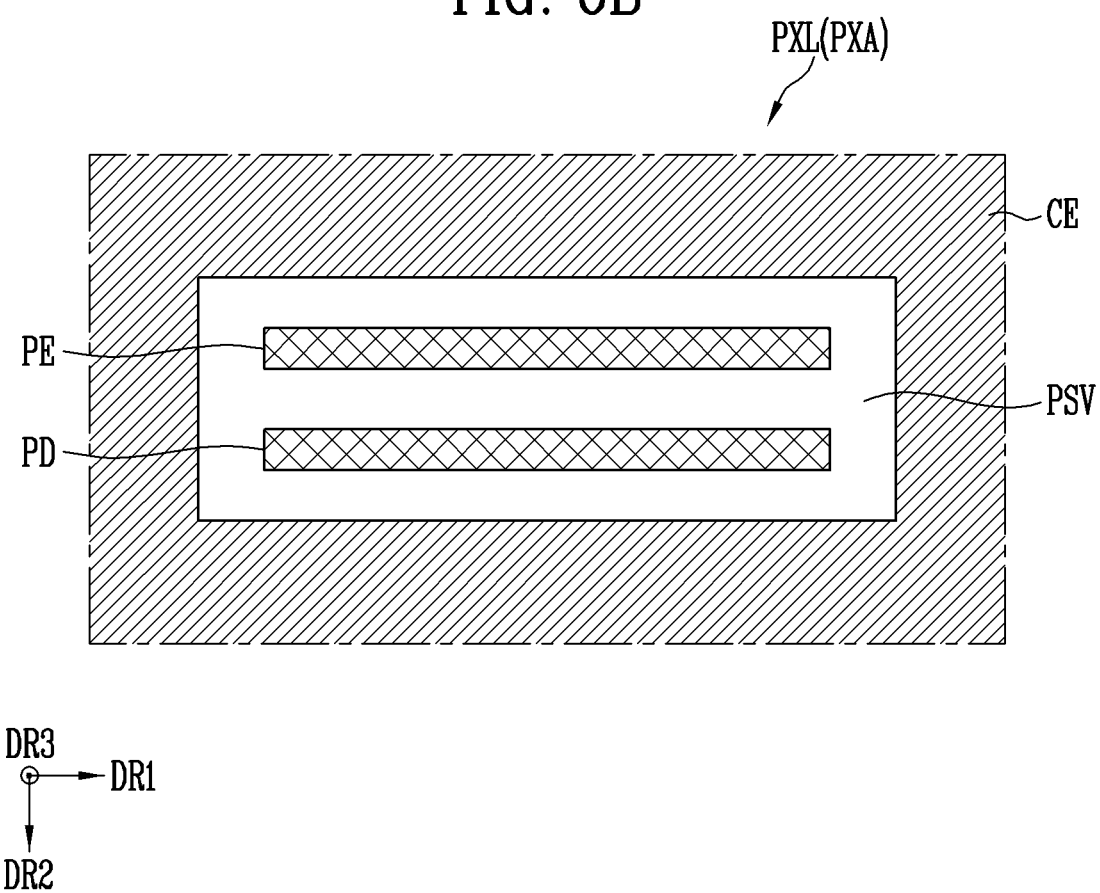
FIG. 6B is a plan view schematically illustrating a pixel based on a pixel electrode and a pad electrode of FIG. 4B according to some example embodiments.

FIGS. 4A to 4C schematically illustrate a pixel in according to some example embodiments of the present disclosure, and are schematic cross-sectional views illustrating a coupling structure between a driving transistor and a light emitting element shown in FIG. 3, FIG. 5A is a side sectional view schematically illustrating a semiconductor structure of FIG. 4A, FIG. 5B is a side sectional view schematically illustrating the light emitting element of FIG. 4A, FIG. 6A is a plan view schematically illustrating a pixel based on a pixel electrode and a pad electrode of FIG. 4A, and FIG. 6B is a plan view schematically illustrating a pixel based on a pixel electrode and a pad electrode of FIG. 4B.

Although FIGS. 4A to 4C simply illustrate one pixel PXL, e.g., illustrating that each electrode is formed of a single electrode layer and each insulating layer is formed of a single insulating layer, embodiments according to the present disclosure are not limited thereto.

According to some example embodiments of the present disclosure, the term "coupling" between two components may mean both electrical and physical couplings.

Furthermore, in the description of embodiments of the present disclosure, "components are provided and/or formed on the same layer" may mean that the components are formed through the same process, and "components are provided and/or formed on different layers may mean that the components are formed through different processes.

According to some example embodiments of the present disclosure, for the convenience of description, a width direction (or horizontal direction) on a plane is indicated by a first direction DR1, a length direction (or vertical direction) on the plane is indicated by a second direction DR2, and a thickness direction of the substrate SUB on a section is indicated by a third direction DR3. The first to third directions DR1, DR2, and DR3 may refer to the directions indicated by the first to third directions DR1, DR2, and DR3, respectively.

Referring to FIGS. 4A to 6B, the pixel PXL according to some example embodiments may include a substrate SUB, a display element layer DPL, and a pixel circuit layer PCL. The pixel PXL may emit light towards the rear surface of the substrate SUB.

Because the substrate SUB has the same configuration as the substrate SUB described with reference to FIG. 2, a detailed description thereof will be omitted. According to some example embodiments, the substrate SUB may be polyimide having flexibility, and may be coupled to a semiconductor structure LD' through a curing process. The substrate SUB may include a surface SF2, and a rear surface SF1 facing the surface SF2. According to some example embodiments, the rear surface SF1 of the substrate SUB may become a display surface of the display device.

A plurality of insulating layers and a plurality of conductive layers may be located on the substrate SUB. For instance, the insulating layers may include a barrier layer BRL, a buffer layer BFL, first and second gate insulating layers GI1 and GI2, first and second interlayer insulating layers ILD1 and ILD2, and a passivation layer PSV, which are sequentially provided on the substrate SUB. The conductive layers may be provided and/or formed between the above-described insulating layers. For instance, the conductive layers may include a first conductive layer provided on the substrate SUB, a second conductive layer provided on the barrier layer BRL, a third conductive layer provided on the first gate insulating layer GI1, a fourth conductive layer provided on the second gate insulating layer GI2, a fifth conductive layer provided on the first interlayer insulating layer ILD1, a sixth conductive layer provided on the second interlayer insulating layer ILD2, and a seventh conductive layer provided on the passivation layer PSV. However, the insulating layers and the conductive layers provided on the substrate SUB are not limited to the above-described embodiments. According to some example embodiments, insulating layers and conductive layers other than the insulating layers and the conductive layers may be provided on the substrate SUB.

The display element layer DPL may be provided and/or formed on the surface SF2 of the substrate SUB, for example, on the upper surface in the third direction DR3.

The display element layer DPL may include the light emitting element LD and the barrier layer BRL.

As illustrated in FIGS. 5A and 5B, the light emitting element LD may include a semiconductor structure LD', a first electrode EL1, and a second electrode EL2.

The semiconductor structure LD' may emit light by the recombination of electrons and holes according to current flowing between the first electrode EL1 and the second electrode EL2. Because light emission of the semiconductor structure LD' is controlled based on the foregoing principle, the light emitting element LD may be used as a light source (or light emitting source) of various light emitting devices as well as the pixel PXL.

According to some example embodiments of the present disclosure, the semiconductor structure LD' may include a first semiconductor layer 11, an active layer 12, and a second semiconductor layer 13.

The first semiconductor layer 11 may include, for example, at least one n-type semiconductor layer. For instance, the first semiconductor layer 11 may be an n-type semiconductor layer which includes any one semiconductor material of InAlGaN, GaN, AlGaN, InGaN, AlN, and InN and is doped with a first conductive dopant (or n-type dopant) such as Si, Ge, or Sn. However, the material forming the first semiconductor layer 11 is not limited to this, and the first semiconductor layer 11 may be formed of various other materials. According to some example embodiments of the present disclosure, the first semiconductor layer 11 may include a gallium nitride (GaN) semiconductor material doped with the first conductive dopant (or n-type dopant).

The active layer 12 may be located on a side of the first semiconductor layer 11 and have a single or multiple quantum well structure. For instance, when the active layer 12 has a multiple quantum well structure, the active layer 12 may be formed by periodically and repeatedly stacking a barrier layer, a strain reinforcing layer, and a well layer as one unit. The strain reinforcement layer has a lattice constant smaller than that of the barrier layer, and thus may further strengthen strain applied to the well layer, for example, compression strain. However, the structure of the active layer 12 is not limited to the above-described embodiments.

The active layer 12 may emit light having a wavelength ranging from 400 nm to 900 nm, and use a double hetero structure. According to some example embodiments of the present disclosure, a clad layer doped with the conductive dopant may be formed on and/or under the active layer 12 in the third direction DR3. For example, the clad layer may be formed of an AlGaN layer or an InAlGaN layer. According to some example embodiments, a material such as AlGaN or InAlGaN may be used to form the active layer 12, and various other materials may be used to form the active layer 12. The active layer 12 may include a first surface that is in contact with the first semiconductor layer 11, and a second surface that is in contact with the second conductive semiconductor layer 13.

The second semiconductor layer 13 is located on the second surface of the active layer 12, and provides a hole to the active layer 12. The second semiconductor layer 13 may include a semiconductor layer of a type different from that of the first semiconductor layer 11. For example, the second semiconductor layer 13 may include at least one p-type semiconductor layer. For instance, the second semiconductor layer 13 may include a p-type semiconductor layer which includes any one semiconductor material of InAlGaN, GaN, AlGaN, InGaN, AlN, and InN, and is doped with a second conductive dopant (or p-type dopant) such as Mg. However, the material forming the second semiconductor layer 13 is not limited to this, and the second semiconductor layer 13 may be formed of various other materials. According to some example embodiments of the present disclosure, the second semiconductor layer 13 may include a gallium nitride (GaN) semiconductor material doped with the second conductive dopant (or p-type dopant). The second semiconductor layer 13 may include a lower surface that is in contact with the second surface of the active layer 12 in the third direction DR3, and an upper surface that is exposed to an outside.

The above-described first semiconductor layer 11, the active layer 12, and the second semiconductor layer 13 may be sequentially stacked on the semiconductor substrate. Here, the semiconductor substrate may include a semiconductor material such as a sapphire substrate or a silicone substrate. This semiconductor substrate may be used as a growth substrate for growing each of the first semiconductor layer 11, the active layer 12, and the second semiconductor layer 13, and then may be separated from the first semiconductor layer 11 by a substrate separation process. Here, the substrate separation process may be performed using a laser lift off method or a chemical lift off method. Thus, as the growth semiconductor substrate is removed from the semiconductor structure LD', the semiconductor structure LD' may have a thin thickness. The above-described semiconductor structure LD' may have a small size corresponding to a micro scale, but embodiments according to the present disclosure are not limited thereto.

The above-described semiconductor structure LD' may include a mesa interface 14. The mesa interface 14 may be formed by removing a portion of each of the second semiconductor layer 13, the active layer 12, and the first semiconductor layer 11 through an etching process. Here, the etching process may be, for instance, a dry etching process.

The first electrode EL1 may be provided and/or formed on the semiconductor structure LD'. For instance, the first electrode EL1 may be provided and/or formed on the second semiconductor layer 13. The first electrode EL1 may be electrically connected to some components of the pixel circuit layer PCL provided thereon. For instance, the first electrode EL1 may be electrically connected to a first terminal ET1 of a driving transistor Tdr of the pixel circuit layer PCL. The driving transistor Tdr may be a first transistor T1 that is described with reference to FIG. 3.

The second electrode EL2 may be provided and/or formed on the semiconductor structure LD'. For instance, the second electrode EL2 may be provided and/or formed on a second side of the first semiconductor layer 11 to be electrically separated from the active layer 12 and the third semiconductor layer 13. The second electrode EL2 may be electrically connected to some components of the pixel circuit layer PCL. For example, the second electrode EL2 may be electrically connected to a common electrode CE of the pixel circuit layer PCL.

Each of the first and second electrodes EL1 and EL2 may be formed of a material having a certain reflectivity to allow light emitted from the light emitting element LD to proceed in an image display direction (e.g. rear-surface direction) of the display device DD (see FIG. 1). For instance, each of the first and second electrodes EL1 and EL2 may be formed of a conductive substance (or material) having a certain reflectivity The conductive substance (or material) may include opaque metal that has an advantage in reflecting, in the image display direction of the display device DD, light emitted from the light emitting element LD. For instance, the opaque metal may include metal such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and alloys thereof. According to some example embodiments, each of the first and second electrodes EL1 and EL2 may include transparent conductive substance (or material). The transparent conductive substance (or material) may include conductive oxide such as indium tin oxide (ITO), indium zinc oxide (IZO), zinc oxide (ZnO), indium gallium zinc oxide (IGZO), or indium tin zinc oxide (ITZO), and a conductive polymer such as PEDOT (poly(3,4-ethylenedioxythiophene)). When each of the first and second electrodes EL1 and EL2 includes transparent conductive substance (or material), a separate conductive layer formed of opaque metal so as to reflect light emitted from the light emitting element LD in the image display direction of the display device DD may be added. However, the material of the first electrode EL1 and the second electrode EL2 is not limited to the above-mentioned materials.

Furthermore, each of the first and second electrodes EL1 and EL2 may be provided and/or formed in a single layer structure, but embodiments according to the present disclosure are not limited thereto. According to some example embodiments, each of the first and second electrodes EL1 and EL2 may be provided and/or formed in a multi-layer structure in which at least two or more of metals, alloys, conductive oxides, and conductive polymers are stacked. Each of the first and second electrodes EL1 and EL2 may be formed of a multi-layer structure having at least two or more layers to minimize distortion due to signal delay when a signal (or voltage) is transmitted to both ends of the light emitting element LD. For instance, each of the first and second electrodes EL1 and EL2 may be formed of a multi-layer structure in which indium tin oxide (ITO)/silver (Ag)/ indium tin oxide (ITO) are sequentially stacked in this order.

According to some example embodiments of the present disclosure, the first and second electrodes EL1 and EL2 may be a first conductive layer provided and/or formed on the substrate SUB. The first and second electrodes EL1 and EL2 may be provided and/or formed on the semiconductor structure LD' by performing a process using a mask. For instance, the first electrode EL1 may be provided and/or formed on the second semiconductor layer 13 of the semiconductor structure LD', and the second electrode EL2 may be provided and/or formed on the first semiconductor layer 11 of the semiconductor structure LD'.

The above-described semiconductor structure LD' may emit light by the recombination of electrons and holes according to current flowing between the first electrode EL1 and the second electrode EL2. In this case, light emitted from the semiconductor structure LD' may proceed to the rear surface of the substrate SUB, so that the display device DD may display an image.

According to some example embodiments, an area of the display area DA of the substrate SUB in which the pixel PXL is provided, for example, the pixel area PXA may include an emission area EMA. The emission area EMA may be an area in which light is finally emitted from the light emitting element LD to the rear surface of the display device DD.

The barrier layer BRL may be provided and/or formed on the light emitting element LD to cover the light emitting element LD and thereby prevent or reduce instances of moisture, oxygen, or other contaminants penetrating into the light emitting element LD. The barrier layer BRL may be an inorganic insulating layer including inorganic material, but embodiments according to the present disclosure are not limited thereto. According to some example embodiments, the barrier layer BRL may be an organic insulating layer including organic material.

The pixel circuit layer PCL may be provided and/or formed on the barrier layer BRL.

The pixel circuit layer PCL may include at least one transistor, a bridge pattern BRP, a contact line CNL, a common electrode CE, a pixel electrode PE, and a pad electrode PD.

The transistor may include a driving transistor Tdr and a switching transistor. The driving transistor Tdr may be a first transistor T1 that is described with reference to FIG. 3, and the switching transistor may be a second transistor T2 that is described with reference to FIG. 3. The driving transistor Tdr and the switching transistor may have substantially similar or identical structures. Thus, the description of the switching transistor will be replaced by the description of the driving transistor Tdr.

The driving transistor Tdr may include a gate electrode GE, an active pattern ACT, a first terminal ET1, and a second terminal ET2. The first terminal ET1 may be any one of a source area and a drain area, and the second terminal ET2 may be a remaining area. For instance, when the first terminal ET1 is the source area, the second terminal ET2 may be the drain area.

The gate electrode GE may be provided and/or formed on a first gate insulating layer GI1. The gate electrode GE may be a third conductive layer provided and/or formed on the first gate insulating layer GI1. The third conductive layer may be a single layer structure formed of a single material or a mixture of materials, which are selected from a group consisting of copper (Cu), molybdenum (Mo), tungsten (W), aluminum neodymium (AlNd), titanium (Ti), aluminum (Al), silver (Ag), and alloys thereof, or may be a double layer structure or a multi-layer structure formed of molybdenum (Mo), titanium (Ti), copper (Cu), aluminum (Al), or silver (Ag), which are low-resistance materials so as to reduce line resistance.

The first gate insulating layer GI1 may be an inorganic insulating layer including inorganic material. For instance, the first gate insulating layer GI1 may include at least one of metal oxides such as silicon nitride (SiNx), silicon oxide (SiOx), silicon oxynitride (SiOxNy), or aluminum oxide (AlOx). However, the material of the first gate insulating layer GI1 is not limited to the above-described embodiments. According to some example embodiments, the first gate insulating layer GI1 may be formed of an organic insulating layer including organic material. The first gate insulating layer GI1 may be provided in a single layer structure, but be provided in a multi-layer structure having at least two or more layers.

Each of the active pattern ACT, the first terminal ET1, and the second terminal ET2 may be a semiconductor pattern made of poly silicon, amorphous silicon, or oxide semiconductor. Each of the active pattern ACT, the first terminal ET1, and the second terminal ET2 may be formed of a semiconductor layer which is not doped with impurities or is doped with impurities. For instance, each of the first terminal ET1 and the second terminal ET2 may be formed of a semiconductor layer which is doped with impurities, and the active pattern ACT may be formed of a semiconductor layer which is not doped with impurities.

Each of the active pattern ACT, the first terminal ET1, and the second terminal ET2 may be provided and/or formed on the buffer layer BFL.

The active pattern ACT may be an area which overlaps the gate electrode GE with the first gate insulating layer GI1 being interposed therebetween, and may be a channel area of the driving transistor Tdr.

The first terminal ET1 may be coupled (or contact) to a first end of the active pattern ACT, and may be coupled (or contact) to the bridge pattern BRP. The second terminal ET2 may be coupled (or contact) to a second end of the active pattern ACT, and may be coupled (or contact) to the contact line CNL.

A second gate insulating layer GI2 may be provided and/or formed on the gate electrode GE.

The second gate insulating layer GI2 may include the same material as that of the first gate insulating layer GI1, or include one or more materials selected from the example materials described as example materials forming the first gate insulating layer GI1. The second gate insulating layer GI2 may be provided in a single layer structure, but be provided in a multi-layer structure having at least two or more layers.

An auxiliary electrode AUX may be provided and/or formed on the second gate insulating layer GI2. The auxiliary electrode AUX may be a fourth conductive layer provided and/or formed on the second gate insulating layer GI2. The fourth conductive layer may include the same material as that of the third conductive layer, or may include one or more materials selected from the example materials described as example materials forming the third conductive layer.

The auxiliary electrode AUX may overlap the gate electrode GE with the second gate insulating layer GI2 being interposed therebetween. The gate electrode GE may be formed of a double layer that is electrically connected to the auxiliary electrode AUX to reduce line resistance and thereby minimize distortion due to signal delay. However, embodiments according to the present disclosure are not limited to this.

A first interlayer insulating layer ILD1 may be provided and/or formed on the auxiliary electrode AUX. The first interlayer insulating layer ILD1 may include the same material as that of the first gate insulating layer GI1, or include one or more materials selected from the example materials described as example materials forming the first gate insulating layer GI1.

The bridge pattern BRP and the contact line CNL may be provided and/or formed on the first interlayer insulating layer ILD1. When viewed in a cross-section, the bridge pattern BRP and the contact line CNL may be located on the first interlayer insulating layer ILD1 to be spaced apart from each other.

The bridge pattern BRP and the contact line CNL may be a fifth conductive layer which is provided and/or formed on the first interlayer insulating layer ILD1. The fifth conductive layer may include the same material as that of the third conductive layer, or may include one or more materials selected from the example materials described as example materials forming the third conductive layer.

The bridge pattern BRP may be connected to the first terminal ET1 of the driving transistor Tdr through a contact hole which sequentially passes through the first interlayer insulating layer ILD1, the second gate insulating layer GI2, and the first gate insulating layer GI1. Furthermore, the bridge pattern BRP may be connected to the first electrode EL1 of the light emitting element LD through a contact hole which sequentially passes through the first interlayer insulating layer ILD1, the second gate insulating layer GI2, the first gate insulating layer GI1, the buffer layer BFL, and the barrier layer BRL. Thus, the first electrode EL1 and the driving transistor Tdr1 may be electrically connected to each other through the bridge pattern BRP.

The contact line CNL may be connected to the second terminal ET2 of the driving transistor Tdr through the contact hole which sequentially passes through the first interlayer insulating layer ILD1, the second gate insulating layer GI2, and the first gate insulating layer GI1.

The second interlayer insulating layer ILD2 may be provided and/or formed on the bridge pattern BRP and the contact line CNL.

The second interlayer insulating layer ILD2 may be an inorganic insulating layer including inorganic material. For instance, the second interlayer insulating layer ILD2 may include at least one of metal oxides such as silicon nitride (SiNx), silicon oxide (SiOx), silicon oxynitride (SiOxNy), or aluminum oxide (AlOx). However, the material of the second interlayer insulating layer ILD2 is not limited to the above-described embodiments. According to some example embodiments, the second interlayer insulating layer ILD2 may be formed of an organic insulating layer including organic material. The second interlayer insulating layer ILD2 may be provided in a single layer structure, but be provided in a multi-layer structure having at least two or more layers.

A common electrode CE may be provided and/or formed on the second interlayer insulating layer ILD2. The common electrode CE may be a sixth conductive layer provided and/or formed on the second interlayer insulating layer ILD2. The sixth conductive layer may include the same material as that of the third conductive layer, or may include one or more materials selected from the example materials described as example materials forming the third conductive layer.

According to some example embodiments, the common electrode CE may be provided on the second interlayer insulating layer ILD2 so as not to overlap the contact line CNL. This is to ensure that the pixel electrode PE, the contact line CNL, and the common electrode CE are electrically separated while securing a contact area so that the contact line CNL and the pixel electrode PE are electrically connected to each other.

The common electrode CE may be connected to the second electrode EL2 of the light emitting element LD through a contact hole which sequentially passes through the second interlayer insulating layer ILD2, the first interlayer insulating layer ILD1, the second gate insulating layer GI2, the first gate insulating layer GI1, the buffer layer BFL, and the barrier layer BRL. The common electrode CE may be configured to electrically connect the second electrode EL2 and the pad electrode PD, and may be defined as a cathode electrode.

According to some example embodiments, the common electrode CE may be extended and provided in the shape of a plate in areas other than an area on the second interlayer insulating layer ILD2. In this case, the common electrode CE may be used as a cooling electrode for dissipating heat generated from the light emitting element LD. Furthermore, when the common electrode CE is extended and provided in the shape of the plate, the resistance of the common electrode CE is reduced, so that instances of delay of a signal supplied to the common electrode CE may be prevented or reduced.

The passivation layer PSV may be provided and/or formed on the common electrode CE.

The passivation layer PSV may be provided in the shape of including an organic insulating layer, an inorganic insulating layer, or the organic insulating layer located on the inorganic insulating layer. The inorganic insulating layer may include at least one of metal oxides such as silicon oxide (SiOx), silicon nitride (SiNx), silicon oxynitride (SiOxNy), or aluminum oxide (AlOx), for example. The organic insulating layer may include, for example, at least one of polyacrylates resin, epoxy resin, phenolic resin, polyamides resin, polyimides rein, unsaturated polyesters resin, poly-phenylen ethers resin, poly-phenylene sulfides resin, or benzocyclobutene resin.

According to some example embodiments, as shown in FIG. 4B, an area of the passivation layer PSV may be removed to expose at least a portion of the common electrode CE to the outside. When at least a portion of the common electrode CE is exposed to the outside, the common electrode CE may more efficiently dissipate heat generated from the light emitting element LD. In this case, an area of the passivation layer PSV may be removed in various shapes within a range in which the common electrode CE and the pixel electrode PE may be electrically insulated. For instance, an area of the passivation layer PSV may be removed to have a mesh shape as shown in FIG. 6A, or an area of the passivation layer may be removed to have a shape of a bar extending in a first direction DR1 as shown in FIG. 6B.

The pixel electrode PE and the pad electrode PD may be provided and/or formed on the passivation layer PSV. When viewed in a cross-section, the pixel electrode PE and the pad electrode PD are provided on the passivation layer PSV to be spaced apart from each other in the first direction DR1. The pixel electrode PE and the pad electrode PD may be provided on the same layer, may include the same material, and may be formed through the same process. According to some example embodiments, the pixel electrode PE and the pad electrode PD may be a seventh conductive layer provided and/on formed on the passivation layer PSV. As the display device DD is configured in a bottom emission method, the seventh conductive layer may include an opaque conductive material having a reflectivity (e.g., a set or predetermined reflectivity). In this case, the pixel electrode PE and the pad electrode PD may include the same material as the first and second electrodes EL1 and EL2, or may include one or more materials selected from the example materials described as example materials forming the first and second electrodes EL1 and EL2.

The pixel electrode PE may be electrically connected to the contact line CNL through the contact hole that sequentially passes through the passivation layer PSV and the second interlayer insulating layer ILD2. Thus, the pixel electrode PE may be electrically connected to the driving transistor Tdr through the contact line CNL. Furthermore, the pixel electrode PE may be electrically connected to the first electrode EL1 of the light emitting element LD through the driving transistor Tdr and the bridge pattern BRP. The pixel electrode PE may be defined as an anode electrode that electrically connects the first electrode EL1 of the light emitting element LD and the driving transistor Tdr.

In addition, the pixel circuit layer PCL may include a dummy pattern DMP provided and/or formed on the barrier layer BRL. The dummy pattern DMP may be provided between the light emitting element LD and the driving transistor Tdr to prevent or reduce instances of light emitted from the light emitting element LD proceeding to the driving transistor Tdr. To this end, the dummy pattern DMP may be formed of an opaque conductive substance (or material) having a reflectivity (e.g., a set or predetermined reflectivity). For instance, the dummy pattern DMP may include the same material as the first and second electrode EL1 and EL2, but embodiments according to the present disclosure are not limited thereto. When the dummy pattern DMP is formed of the opaque conductive substance, the dummy pattern DMP may be the second conductive layer provided and/or formed on the barrier layer BRL.

Unless light emitted from the light emitting element LD flows into the driving transistor Tdr, the presence of the dummy pattern DMP is not limited. That is, according to some example embodiments, the dummy pattern DMP may be omitted.

In the above-described embodiments, after the semiconductor structure LD' including the mesa interface 14 is transferred to a transfer base substrate, the semiconductor structure may be positioned on the substrate SUB by a carrying mechanism to be retransferred to the substrate SUB. In this case, the substrate SUB may be formed of uncured polyimide. After the semiconductor structure LD' is retransferred to the substrate SUB formed of uncured polyimide, a curing process is performed to cure the substrate SUB. In this case, the semiconductor structure LD' provided on a surface of the substrate SUB may be stably secured to the substrate SUB. In other words, the semiconductor structure LD' may be coupled to the substrate SUB. After the curing process, the transfer base substrate may be removed. According to some example embodiments, the substrate SUB may have a thickness thicker than the light emitting element LD in the third direction DR3. For instance, the substrate SUB may have the thickness of about 10 μm to 20 μm in the third direction DR3, but embodiments according to the present disclosure are not limited thereto.

As described above, the first electrode EL1 and the second electrode EL2 may be directly formed by performing a process using a mask on the semiconductor structure LD' fixed on the substrate SUB. Each of the first and second electrodes EL1 and EL2 may be electrically connected with a corresponding component of the pixel circuit layer PCL located thereabove through a process using the mask. Thus, the light emitting element LD and the pixel circuit layer PCL may stably come into contact with each other, thus preventing or reducing instances of a contact failure between the light emitting element LD and the pixel circuit layer PCL.

In a conventional chip bonding method where the package type of light emitting element LD having the first electrode EL1 and the second electrode EL2 sequentially formed on the semiconductor structure LD' that is subjected to mesa etching is electrically connected to the pixel circuit layer PCL after the first semiconductor layer 11, the active layer 12, and the second semiconductor layer 13 are sequentially formed, a method such as pressing, heating, or laser is used. The bonding method such as pressing, heating or laser causes damage to the light emitting element LD and the pixel circuit layer PCL, thus causing a contact failure between the light emitting element LD and the pixel circuit layer PCL. Furthermore, because components applied to the light emitting element LD and the pixel circuit layer PCL should be selected as materials that may withstand heat generated during bonding, the material of the light emitting element LD and the pixel circuit layer PCL may be restricted.

Thus, according to some example embodiments of the present disclosure, after the semiconductor structure LD' including the mesa interface 14 is transferred and fixed onto the substrate SUB formed of uncured polyimide, the process using the mask is performed to form the first electrode EL1 and the second electrode EL2 on the semiconductor structure LD' and the pixel circuit layer PCL is located thereon, thus minimizing damage to the light emitting element LD and the pixel circuit layer PCL. Thus, the contact failure between the light emitting element LD and the pixel circuit layer PCL may be reduced.

When the semiconductor structure LD' is transferred and fixed onto the substrate SUB formed of uncured polyimide, the first semiconductor layer 11 of the semiconductor structure LD' may not be positioned on the same line as the surface SF2 of the substrate SUB as shown in FIG. 4A, but may be positioned under the surface SF2 in the third direction DR3. However, embodiments according to the present disclosure are not limited thereto. According to some example embodiments, the first semiconductor layer 11 of the semiconductor layer LD' may be positioned on the same line as the surface SF2 of the substrate SUB, as shown in FIG. 4C.

FIGS. 7A to 7I are schematic cross-sectional views sequentially illustrating a method of fabricating a pixel in according to some example embodiments.

In FIGS. 7A to 7I, differences from the above-described embodiments will be mainly described so as to avoid a duplicated description.

Figure 7A:
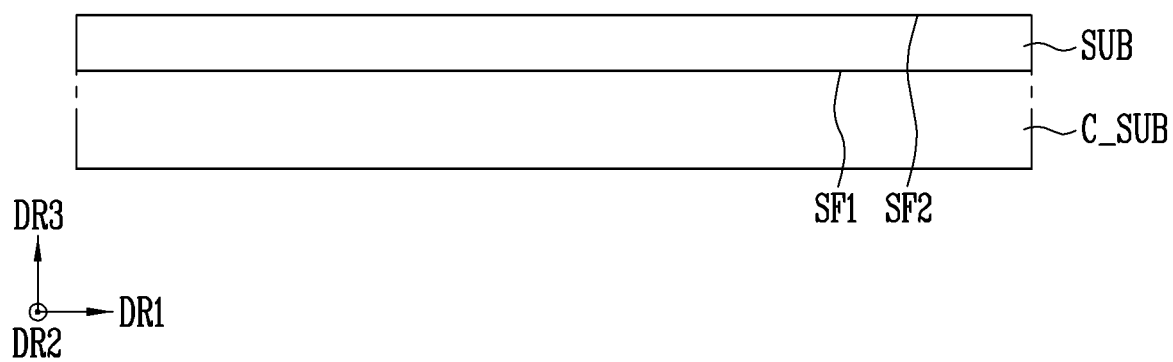
FIGS. 7A to 7L are schematic cross-sectional views sequentially illustrating a method of fabricating a pixel according to some example embodiments.

Referring to FIG. 7A, the substrate SUB located on a base layer C_SUB is prepared. A first sacrificial layer may be provided between the base layer C_SUB and the substrate SUB.

The first sacrificial layer serves to fix the base layer C_SUB and the substrate SUB, and may include a material that may be easily peeled off in a peeling process using a laser.

The substrate SUB may be formed by coating a polymer solution onto the base layer C_SUB by a method such as slit coating or spin coating. For instance, the substrate SUB may be formed of uncured polyimide.

The base layer C_SUB may be a support substrate supporting the substrate SUB while performing a series of processes. The base layer C_SUB may include a rigid substrate such as glass.

Figure 7B:
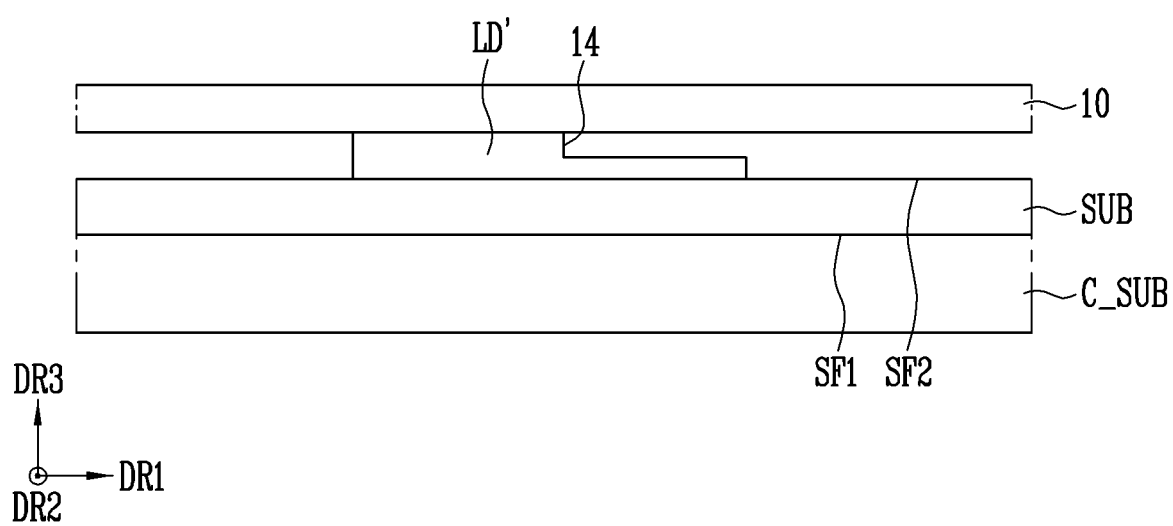

Referring to FIGS. 7A and 7B, the transfer base substrate 10 onto which the semiconductor structure LD' is transferred is located on the substrate SUB.

A method in which the semiconductor LD' is transferred onto the transfer base substrate 10 and then is re-transferred to the substrate SUB will be described below with reference to FIGS. 8A to 8E.

Because the semiconductor structure LD' has the same configuration as the semiconductor structure LD' described with reference to FIG. 5A, a detailed description thereof will be omitted.

The transfer base substrate 10 may be a transparent substrate including sapphire ($Al_2O_3$), glass, polyimide, or the like. Thus, the transfer base substrate 10 may transmit laser light irradiated from the top and/or the bottom. A second sacrificial layer may be provided on the transfer base substrate 10. The semiconductor structure LD' may be formed on the second sacrificial layer on the transfer base substrate 10. For the second sacrificial layer, materials that are easily peeled off by irradiated laser may be selected among materials having adhesion (or cohesion).

The semiconductor structure LD' may include the mesa interface 14, and the first semiconductor layer 11 (see FIG. 5A) and the second semiconductor layer 13 (see FIG. 5A)

exposed to the outside may be positioned in the direction of the transfer base substrate 10.

Figure 7C:
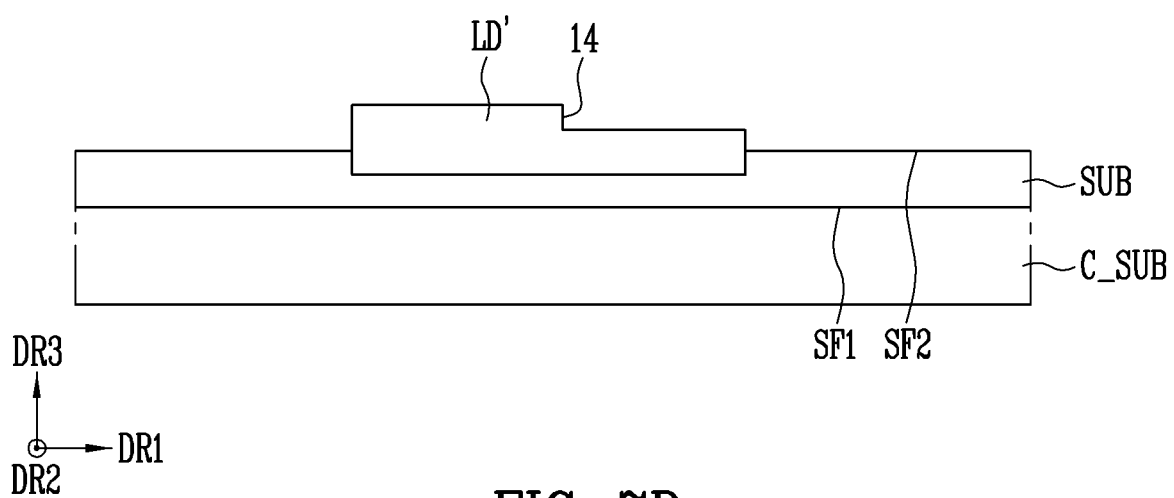
Figure 7D:
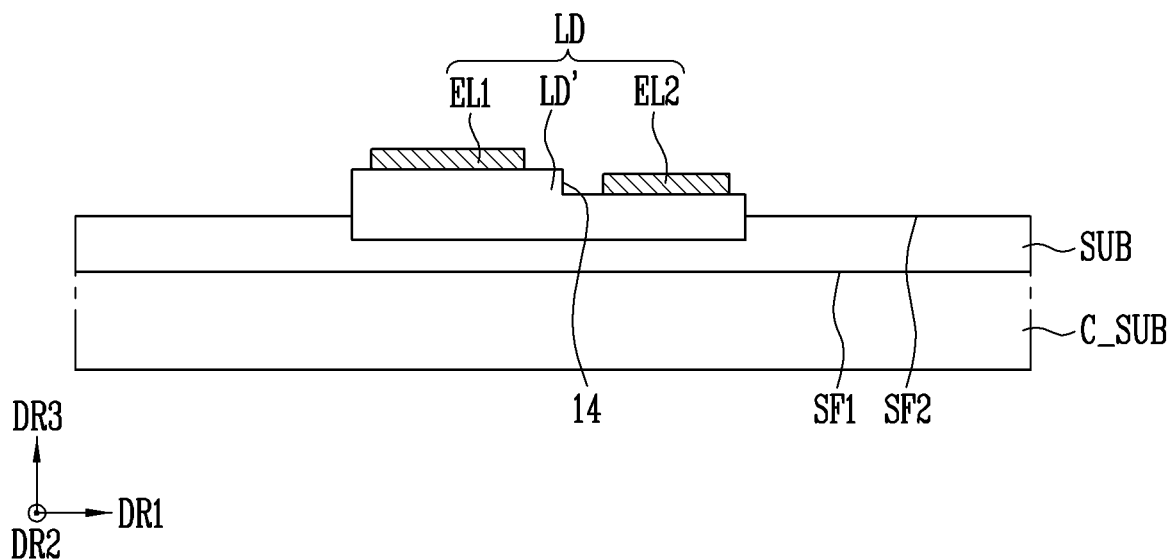
Figure 7E:
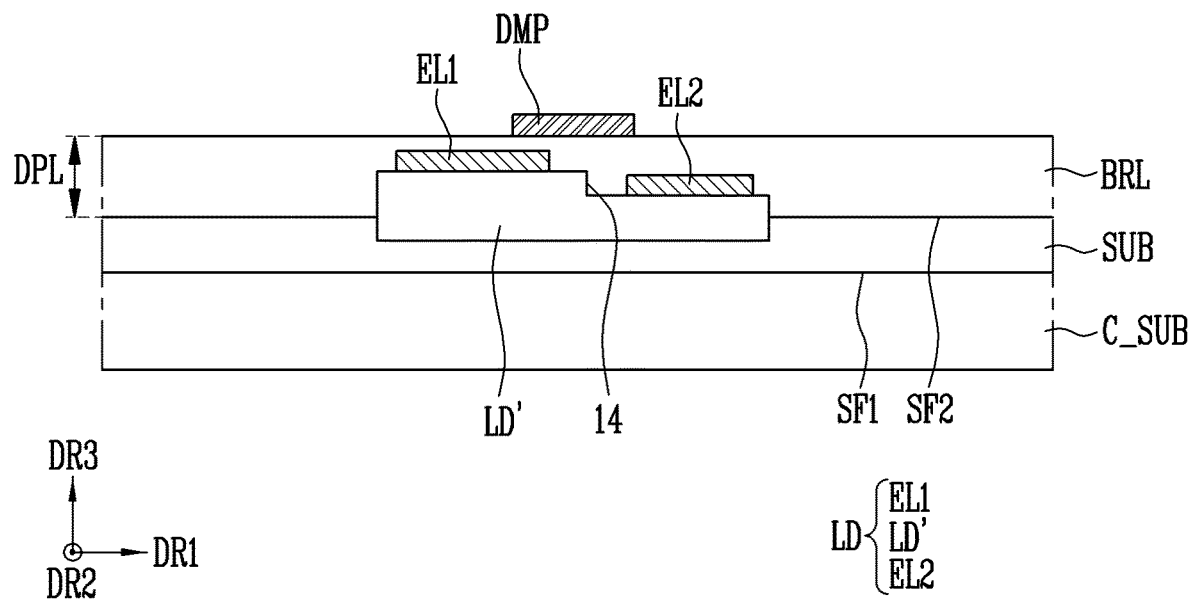
Figure 7F:
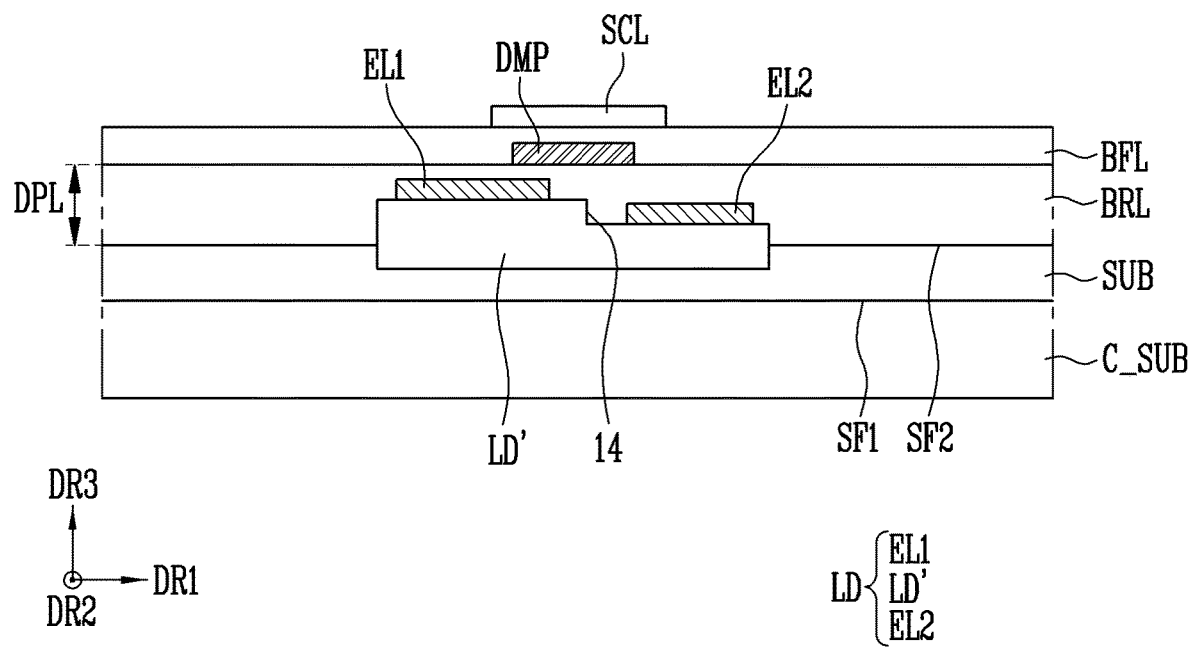
Figure 7G:
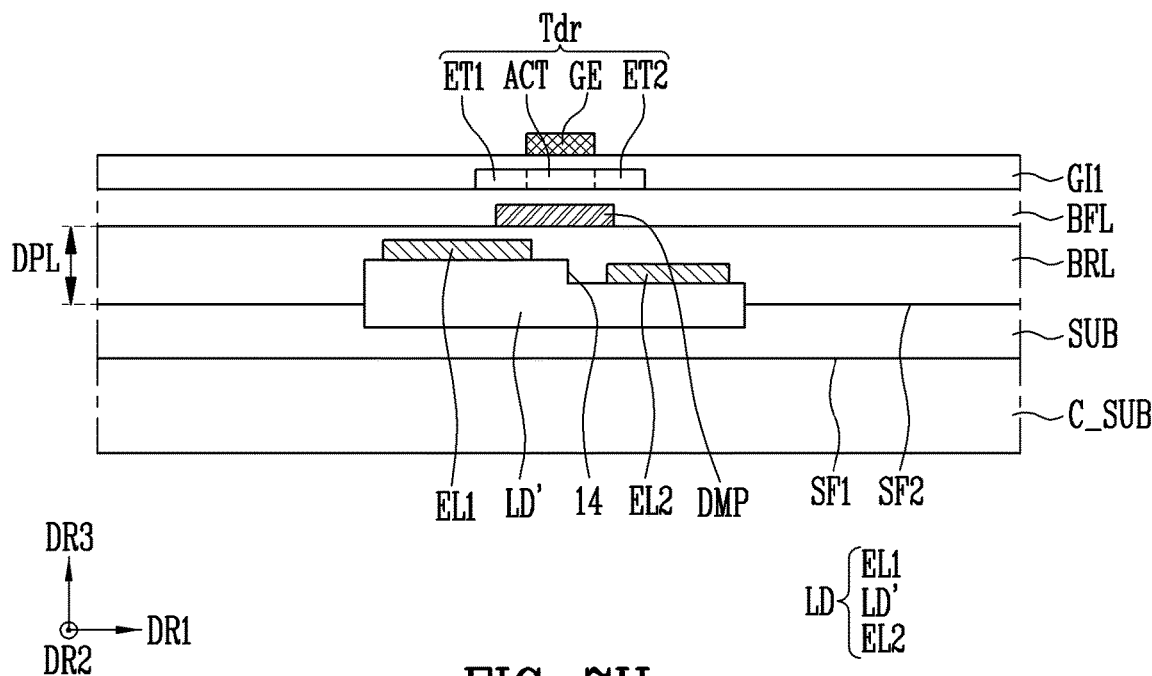
Figure 7H:
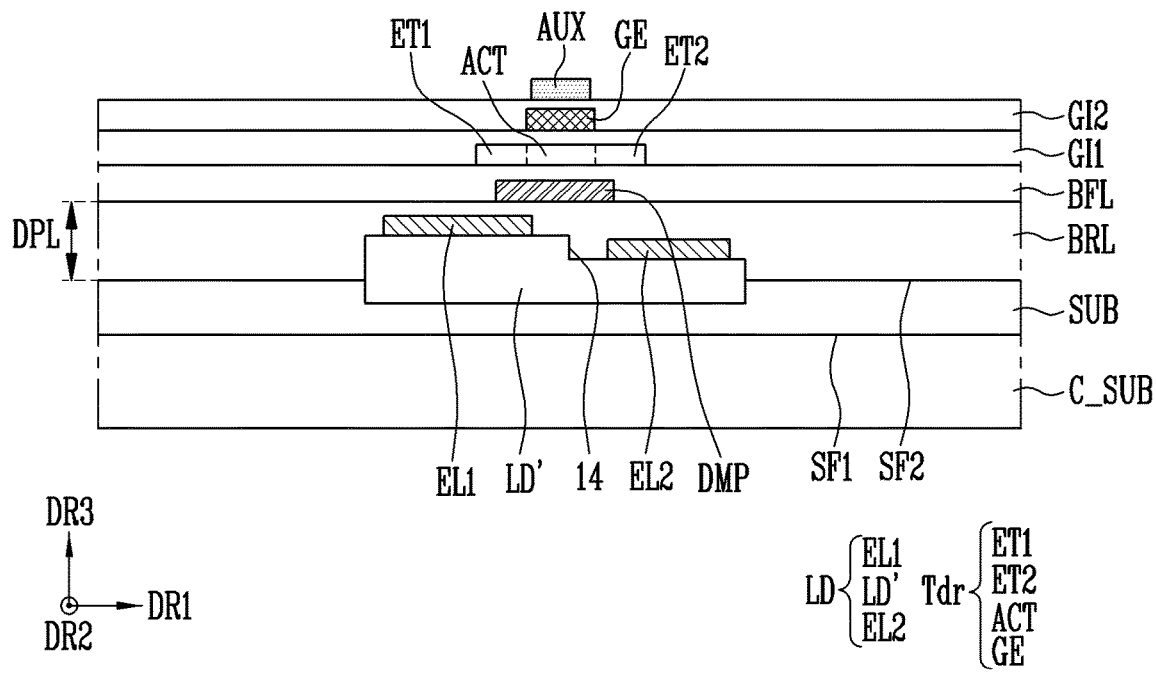
Figure 7I:
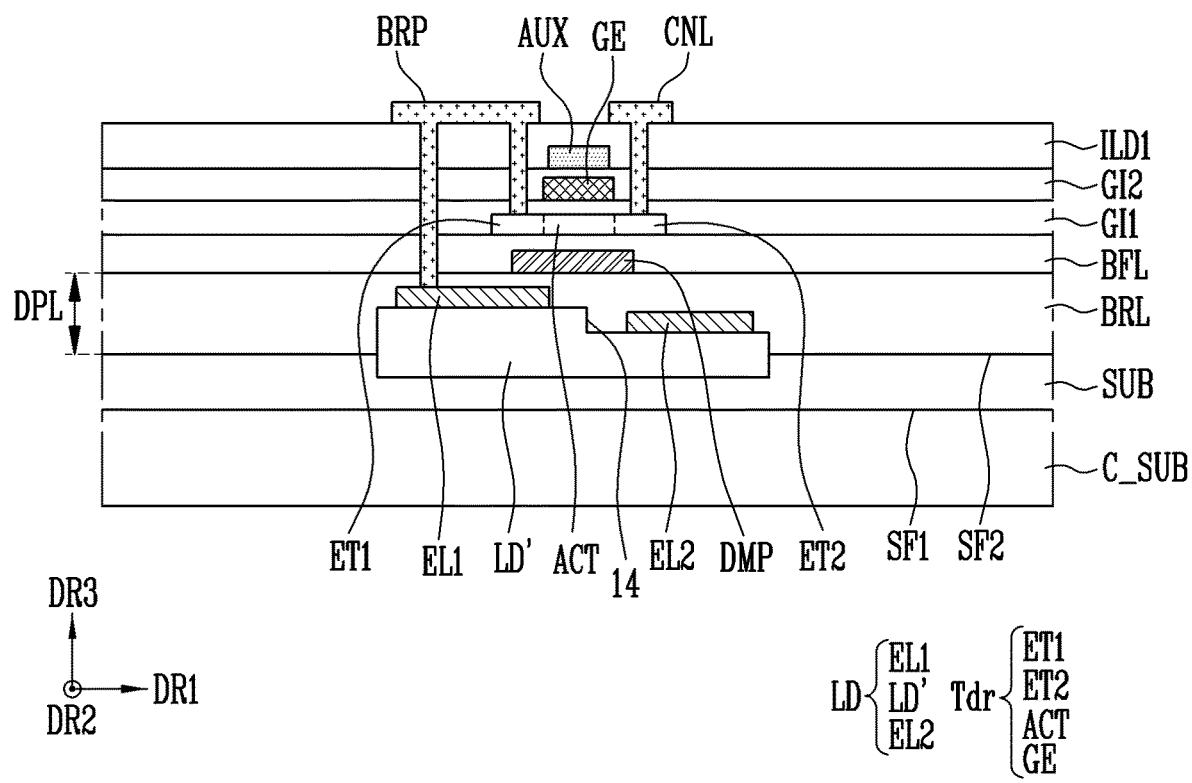
Figure 7J:
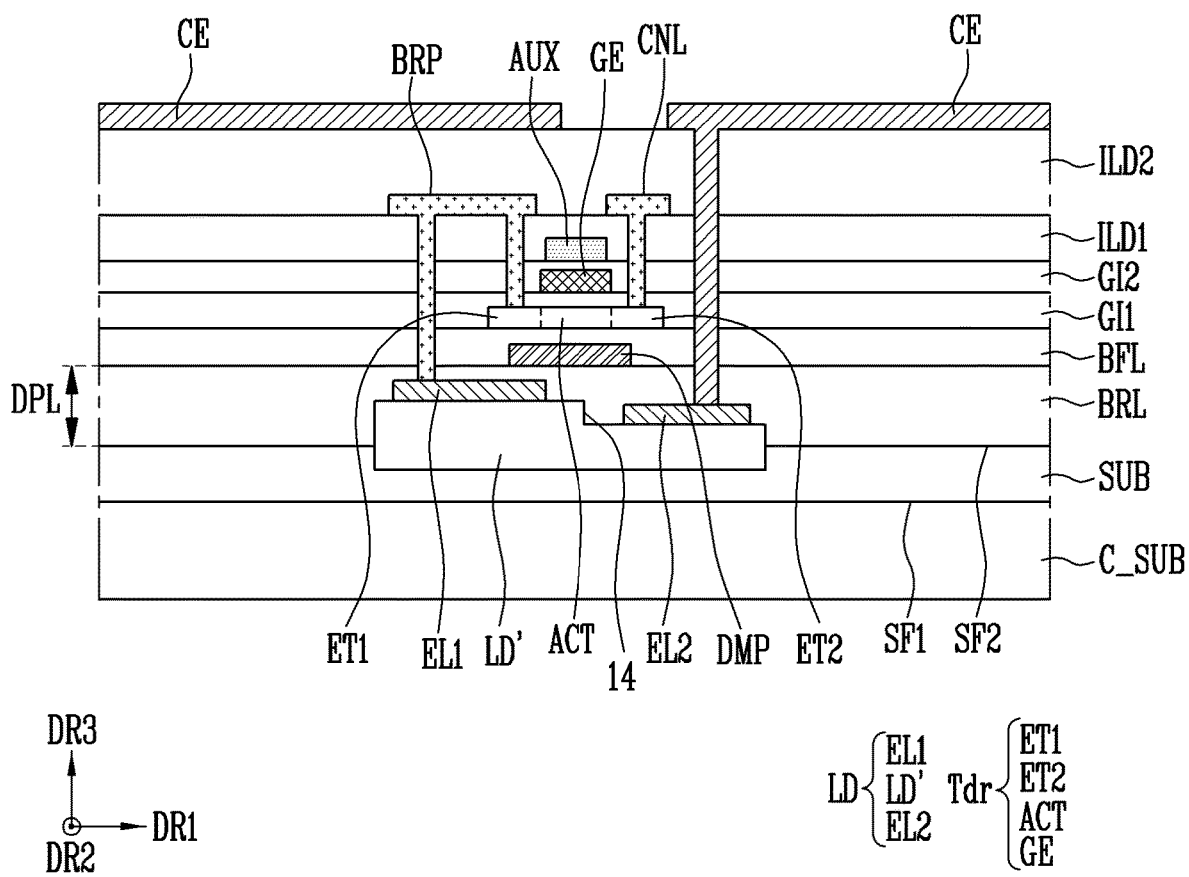
Figure 7K:
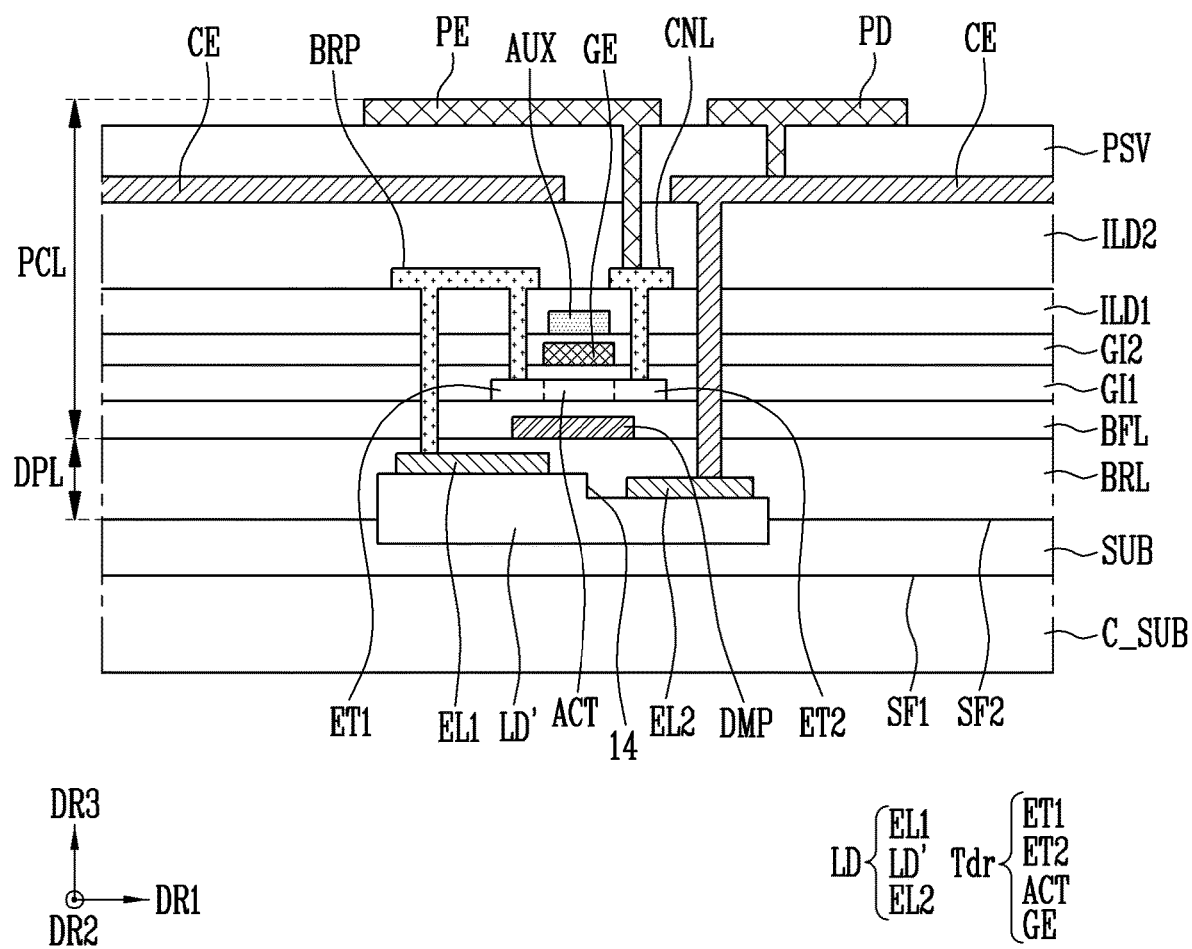
Figure 7L:
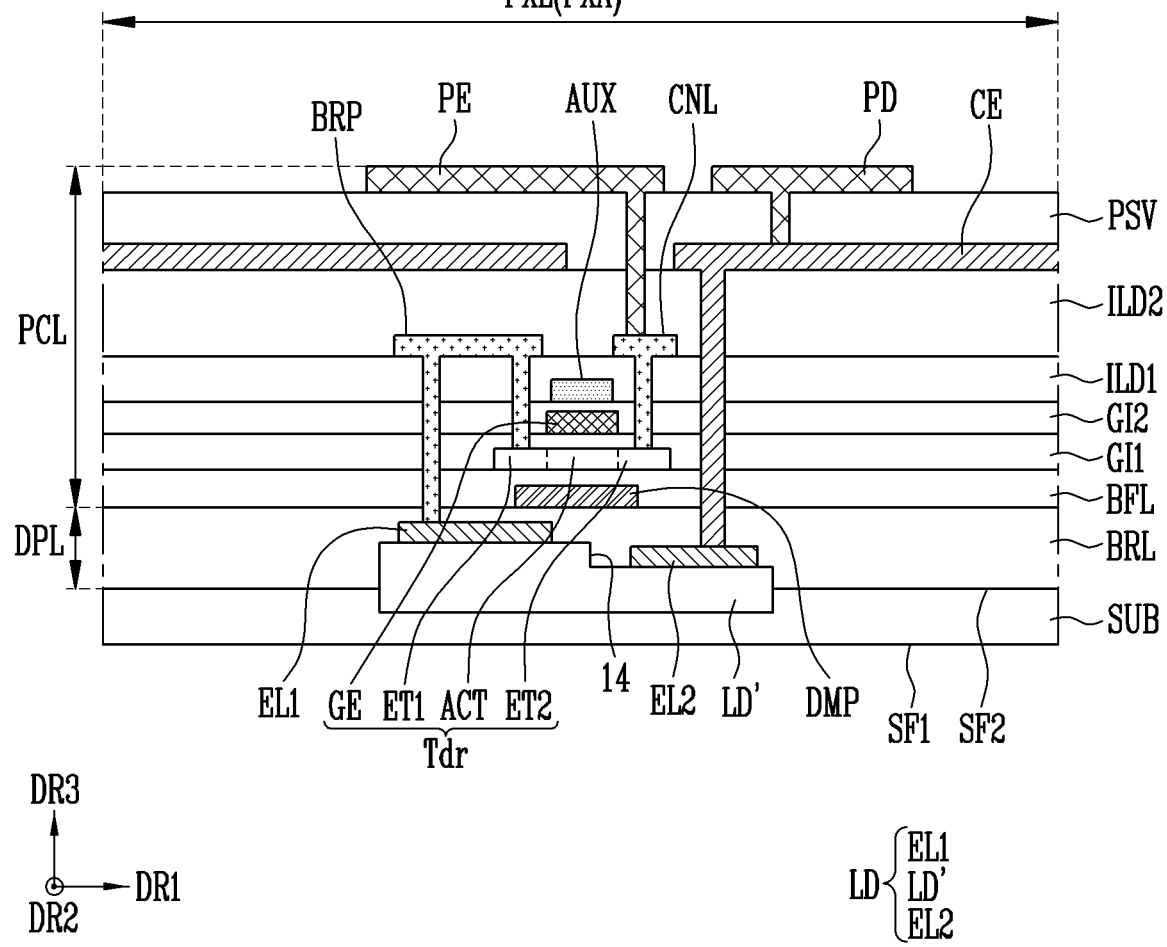

Referring to FIGS. 7A to 7C, after the substrate SUB is cured to fix the semiconductor structure LD' onto the surface SF2 of the substrate SUB, the transfer base substrate 10 is separated from the substrate SUB.

The method of separating the transfer base substrate 10 may be performed through the laser irradiation, but embodiments according to the present disclosure are not limited thereto. If laser is irradiated onto the transfer base substrate 10, the second sacrificial layer and the semiconductor structure LD' may be physically separated from each other. For example, the second sacrificial layer may lose a cohesive function when laser is irradiated.

After the laser irradiation, the transfer base substrate 10 may be separated from the semiconductor structure LD'. Thus, the semiconductor structure LD' may be stably fixed onto the surface SF2 of the cured substrate SUB. In the semiconductor structure LD' separated from the transfer base substrate 10, the first semiconductor layer 11 and the second semiconductor layer 13 may be exposed to the outside.

Referring to FIGS. 7A to 7D, after the metal layer is applied to the substrate SUB on which the semiconductor structure LD' is located, the process using the mask is performed to form the first electrode EL1 and the second electrode EL2.

The first electrode EL1 may be located on the second semiconductor layer 13 exposed to the outside, and the second electrode EL2 may be located on the first semiconductor layer 11 exposed to the outside.

Through the above-described process, the light emitting element LD including the semiconductor structure LD', the first electrode EL1, and the second electrode EL2 may be implemented.

Referring to FIGS. 7A to 7E, the barrier layer BRL is formed on the first and second electrodes EL1 and EL2, and the dummy pattern DMP is formed on the barrier layer BRL.

The dummy pattern DMP may block light emitted from the light emitting element LD from flowing into the pixel circuit layer (see "PCL" in FIG. 4A) positioned thereon. The dummy pattern DMP may include an opaque conductive material having a reflectivity (e.g., a set or predetermined reflectivity).

Referring to FIGS. 7A to 7F, the buffer layer BFL is formed on the dummy pattern DMP, and the semiconductor layer SCL is formed on the buffer layer BFL.

The semiconductor layer SCL may be made of silicon, that is, amorphous silicon, or may be made of polysilicon. In the case where the semiconductor layer SCL is formed of amorphous silicon, a crystallization process using a laser may be further performed. According to some example embodiments, the semiconductor layer SCL may be formed of semiconductor oxide.

Referring to FIGS. 7A to 7G, the first gate insulating layer GI1 is formed on the semiconductor layer SCL, and the gate electrode GE is formed on the first gate insulating layer GI1.

An area of the semiconductor layer SCL that overlaps the gate electrode GE may become the active pattern ACT. Both sides of the active pattern ACT that does not overlap the gate electrode GE may become the first terminal ET1 and the second terminal ET2. The active pattern ACT, the first terminal ET1, the second terminal ET2, and the gate electrode GE may form the driving transistor Tdr.

Referring to FIGS. 7A to 7H, the second gate insulating layer GI2 is formed on the driving transistor Tdr, and the auxiliary electrode AUX is formed on the second gate insulating layer GI2.

The auxiliary electrode AUX overlaps the gate electrode GE and is electrically connected to the gate electrode GE to form the gate electrode GE as a double layer.

Referring to FIGS. 7A to 7I, the first interlayer insulating layer ILD1 is formed on the auxiliary electrode AUX.

Subsequently, the process using the mask is performed to form at least two contact holes sequentially penetrating the first interlayer insulating layer ILD1, the second gate insulating layer GI2, and the first gate insulating layer GI1, thus exposing an area of each of the first and second terminals ET1 and ET2. Furthermore, an area of the first electrode EL1 may be exposed by forming the contact hole which sequentially passes through the first interlayer insulating layer ILD1, the second gate insulating layer GI2, the first gate insulating layer GI1, the buffer layer BFL, and the barrier layer BRL, through the above-described process.

Subsequently, the bridge pattern BRP and the contact line CNL are formed on the first interlayer insulating layer ILD1. The bridge pattern BRP and the contact line CNL may be located on the first interlayer insulating layer ILD1 to be spaced apart from each other in the first direction DR1.

The bridge pattern BRP may be connected to the first terminal ET1 of the driving transistor Tdr through one contact hole which sequentially passes through the first interlayer insulating layer ILD1, the second gate insulating layer GI2, and the first gate insulating layer GI1. Furthermore, the bridge pattern BRP may be connected to the first electrode EL1 of the light emitting element LD through the contact hole which sequentially passes through the first interlayer insulating layer ILD1, the second gate insulating layer GI2, the first gate insulating layer GI1, the buffer layer BFL, and the barrier layer BRL.

The contact line CNL may be connected to the second terminal ET2 of the driving transistor Tdr through another contact hole which sequentially passes through the first interlayer insulating layer ILD1, the second gate insulating layer GI2, and the first gate insulating layer GI1.

Referring to FIGS. 7A to 7J, the second interlayer insulating layer ILD2 is formed on the bridge pattern BRP and the contact line CNL.

Subsequently, an area of the second electrode EL2 is exposed by forming the contact hole which sequentially passes through the second interlayer insulating layer ILD2, the first interlayer insulating layer ILD1, the second gate insulating layer GI2, the first gate insulating layer GI1, the buffer layer BFL, and the barrier layer BRL, through the process using the mask.

Subsequently, the common electrode CE is formed on the second interlayer insulating layer ILD2. The common electrode CE may be connected to the second electrode EL2 of the light emitting element LD through the contact hole.

Referring to FIGS. 7A to 7K, the passivation layer PSV is formed on the common electrode CE.

Subsequently, by performing the process using the mask, the contact hole sequentially passing through the passivation layer PSV and the second interlayer insulating layer ILD2 is formed to expose an area of the contact line CNL, and the contact hole passing through the passivation layer PSV is formed to expose an area of the common electrode CE.

Subsequently, the pixel electrode PE and the pad electrode PD are formed on the passivation layer PSV. The pixel electrode PE and the pad electrode PD may be provided on the passivation layer PSV to be spaced apart from each other in the first direction DR1.

The pixel electrode PE may be connected to the contact line CNL through the contact hole that sequentially passes through the passivation layer PSV and the second interlayer insulating layer ILD2.

The pad electrode PD may be connected to the common electrode CE through the contact hole passing through the passivation layer PSV.

Referring to FIG. 7A to 7L, the laser is irradiated to the lower portion of the base layer C_SUB to separate the base layer C_SUB from the rear surface SF1 of the substrate SUB. If the laser is irradiated to the lower portion of the base layer C_SUB, the first sacrificial layer and the substrate SUB may be physically separated from each other. For example, the first sacrificial layer may lose a cohesive function when laser is irradiated.

In the display device formed through the above-described manufacturing process, the first and second electrodes EL1 and EL2 are formed on the semiconductor structure LD' transferred to the substrate SUB through the process using the mask, and components of the pixel circuit layer PCL electrically connected to the first and second electrodes EL1 and EL2 are directly located on the first and second electrodes EL1 and EL2, thus reducing contact resistance between the light emitting element LD and the pixel circuit layer PCL and reducing the contact failure between the light emitting element LD and the pixel circuit layer PCL due to an increase in contact resistance. Furthermore, by performing the process using the mask on the semiconductor structure LD', the first and second electrodes EL1 and EL2 are formed, and the pixel circuit layer PCL is formed on the first and second electrodes EL1 and EL2, thus preventing or reducing the misalignment of the light emitting element LD.

Furthermore, in the above-described display device, because the light emitting element LD and the pixel circuit layer PCL are electrically connected without using a method such as pressing, heating, or laser, damage to the light emitting element LD and the pixel circuit layer PCL is prevented or reduced, thus improving reliability.

Furthermore, in the above-described display device, production and/or process yield can be improved by forming the light emitting element LD and the pixel circuit layer PCL on the same substrate SUB without using the method such as pressing, heating, or laser. In addition, in forming a large-area display device, the present disclosure can be easily applied. In addition, the pixel circuit layer PCL is formed on the light emitting element LD on the substrate SUB to reduce restrictions on critical dimension (CD, the line width of each of the electrodes or the width of a gap between the electrodes) between components included in the pixel PXL, so that it is possible to easily realize a display device having high resolution and fine pitch.

FIGS. 8A to 8E are schematic cross-sectional views sequentially illustrating a transfer method of a semiconductor structure according to some example embodiments of the present disclosure.

Referring to FIGS. 8A to 8E, the transfer method of the semiconductor structure LD' may include selectively irradiating laser onto a plurality of semiconductor structures LD' located on the growth substrate 1 to separate the semiconductor structure LD' from the growth substrate 1, and arranging the separated semiconductor structure LD' on a target substrate SUB. Here, the semiconductor structure LD' may be the semiconductor structure LD' shown in FIG. 5A.

First, referring to FIG. 8A, a plurality of semiconductor structures LD' may be located on the growth substrate 1. In this case, each of the semiconductor structures LD' may be a structure including the mesa interface 14 formed by mesa etching. Each of the semiconductor structures LD' may further include an insulating layer IL covering an outer circumferential surface of each of the first semiconductor layer 11, the active layer 12, and the second semiconductor layer 13 exposed by mesa etching. Here, the insulating layer IL may prevent or reduce instances of the active layer 12 short-circuiting due to making contact with a conductive material except the first semiconductor 11 and the second semiconductor layer 13. The insulating layer IL may include transparent insulating material. For example, the insulating layer IL may include one or more insulating materials selected from a group consisting of silicon oxide (SiOx), silicon nitride (SiNx), silicon oxynitride (SiOxNy), aluminum oxide (AlOx), and titanium oxide (TiOx), but embodiments according to the present disclosure are not limited thereto. Various materials having insulating properties may be used as the material of the insulating layer IL.

Referring to FIG. 8B, the transfer base substrate 10 is arranged over the growth substrate 1. The transfer base substrate 10 may include a bonding layer 10b and a base substrate 10a. Here, the bonding layer 10b may include a material having adhesion (or cohesion), and may be selected as a material that may be easily peeled off from the semiconductor structure LD' by laser irradiation in a subsequent process.

Referring to FIG. 8C, when viewed from the third direction DR3, the semiconductor structure LD' may be selectively separated from the growth substrate 1 by selectively irradiating the laser to the rear surface of the growth substrate 1. A sacrificial layer may be provided between the growth substrate 1 and the semiconductor structure LD'. If the laser is selectively irradiated to the rear surface of the growth substrate 1, the sacrificial layer is decomposed, and the semiconductor structure LD' is easily separated from the growth substrate 1, so that the semiconductor structure LD' may be transferred to the transfer base substrate 10.

Thereafter, when the transfer base substrate 10 is moved upward using a carrying mechanism or the like, the growth substrate 1 and the semiconductor structure LD' on the transfer base substrate 10 may be separated from each other.

Figure 8D:
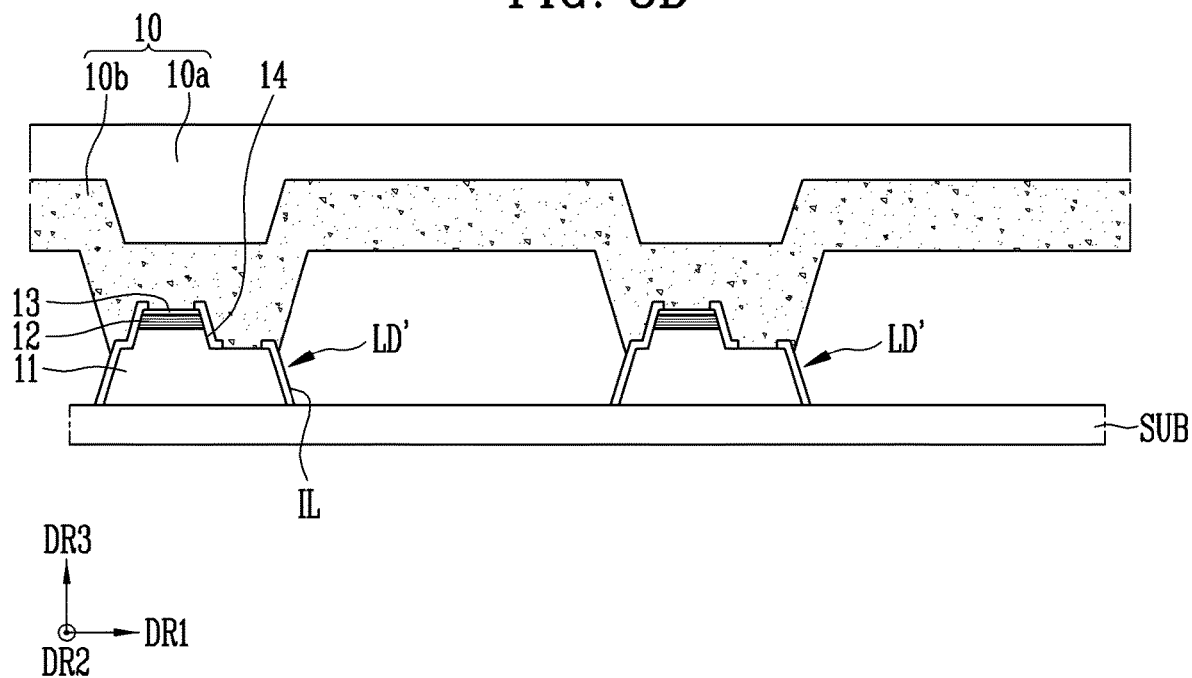

Referring to FIG. 8D, the transfer base substrate 10 to which the semiconductor structure LD' is transferred may be located over the substrate SUB. In this case, the lower surface of the first semiconductor layer 11 of the semiconductor structure LD' may be positioned on a surface of the substrate SUB.

The substrate SUB may be a substrate SUB made of uncured polyimide, which is described with reference to FIG. 7A. After the semiconductor structure LD' is located on the substrate SUB, the substrate SUB is cured using heat treatment or a UV irradiation method. As the substrate SUB is cured, the semiconductor structure LD' located on the substrate SUB may be stably fixed.

Figure 8E:
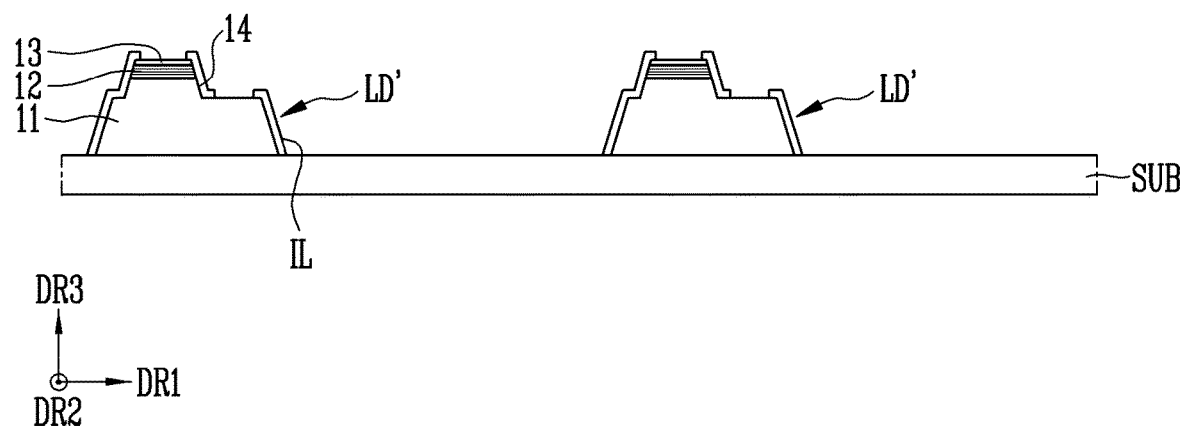

Subsequently, referring to FIG. 8E, the semiconductor structure LD' fixed on the substrate SUB and the transfer base substrate 10 are separated by irradiating a laser onto the transfer base substrate 10. Thus, the semiconductor structure LD' including the mesa interface 14 may be finally re-transferred onto the substrate SUB. Through this method, the semiconductor structure LD' may be stably located on the substrate SUB.

Figure 10:
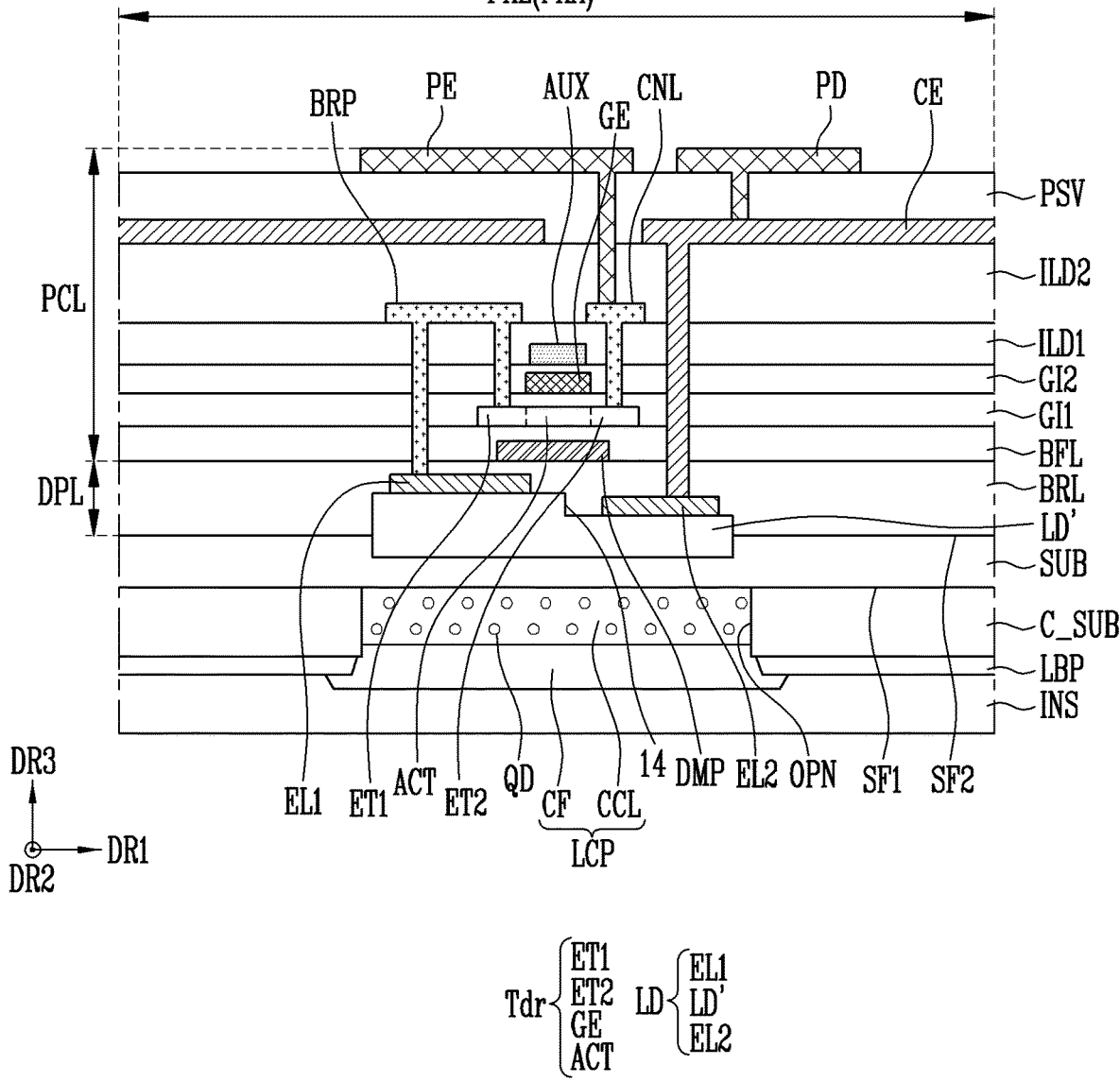

FIGS. 9 and 10 are cross-sectional views schematically illustrating a pixel in according to some example embodiments of the present disclosure.

The pixel shown in FIG. 9 may be substantially equal or similar to the pixel of FIG. 4A except that an optical conversion pattern layer LCP and a light shielding pattern LBP are located on the rear surface SF1 of the substrate SUB.

Furthermore, the pixel shown in FIG. 10 may be substantially equal or similar to the pixel of FIG. 4A except that the base layer C_SUB including the opening OPN is located on the rear surface SF1 of the substrate SUB, and the optical conversion pattern layer LCP is located in the opening OPN.

Therefore, to avoid redundant explanation, the description of the pixel of FIGS. 9 and 10 will be focused on differences from that of the foregoing embodiments.

First, referring to FIG. 9, the pixel PXL according to some example embodiments may include a substrate SUB, a display element layer DPL, and a pixel circuit layer PCL. The pixel PXL may emit light towards the rear surface of the substrate SUB.

A dam structure DAM and the optical conversion pattern layer LCP may be provided on the rear surface SF1 of the substrate SUB.

The dam structure DAM may define the opening OPN that overlaps the light emitting element LD. In other words, the dam structure DAM may define an emission area EMA in which light is emitted from the pixel PXL. Here, the emission area EMA may correspond to the opening OPN.

The dam structure DAM may include at least one light shielding material and/or light absorbing material, thus preventing or reducing instances of light leaking between the pixel PXL and the pixels adjacent thereto. According to some example embodiments, the dam structure DAM may include a transparent substance (or material). The transparent material may include, for example, polyamides resin, polyimides resin and the like, but embodiments according to the present disclosure are not limited thereto.

The light shielding pattern LBP may be provided on the dam structure DAM. The light shielding pattern LBP may be positioned around the emission area EMA in the pixel area PXA where the pixel PXL is provided. The light shielding pattern LBP may be a black matrix pattern formed of the light shielding material or the like in an area other than the opening OPN of the dam structure DAM corresponding to the emission area EMA, but embodiments according to the present disclosure are not limited thereto.

The optical conversion pattern layer LCP may include a color conversion layer CCL and a color filter CF.

The color conversion layer CCL may include color conversion particles QD corresponding to a particular color. The color filter CF may selectively transmit light of the particular color.

The color conversion layer CCL may include color conversion particles QD for converting light emitted from the light emitting element LD located on one surface SF2 of the substrate SUB into light of a particular color. For instance, when the pixel PXL is a red pixel, the color conversion layer CCL may include color conversion particles QD of red quantum dots that convert light emitted from the light emitting element LD into red light. For instance, when the pixel PXL is a green pixel, the color conversion layer CCL may include color conversion particles QD of green quantum dots that convert light emitted from the light emitting element LD into green light. For instance, when the pixel PXL is a blue pixel, the color conversion layer CCL may include color conversion particles QD of blue quantum dots that convert light emitted from the light emitting element LD into blue light. If the light emitting element LD emits blue light, the color conversion layer CCL may include scattering particles that scatter the light.

The color filter CF may be provided on the color conversion layer CCL to form the optical conversion pattern layer LCP together with the color conversion layer CCL, and may include a color filter material that selectively transmits light of a particular color converted in the color conversion layer CCL. The color filter CF may include a red color filter, a green color filter, and a blue color filter. The above-described color filter CF may be provided in the emission area EMA of the pixel area PXA to correspond to the color conversion layer CCL.

The insulating layer INS may be provided on the color filter CF. The insulating layer INS may be an inorganic insulating layer including inorganic material or an organic insulating layer including organic material. For instance, the insulating layer INS may have a structure in which at least one inorganic insulating layer or at least one organic insulating layer are alternately stacked. The insulating layer INS may completely cover the optical conversion pattern layer LCP and the light shielding pattern LBP to prevent or reduce instances of water, contaminants, or moisture flowing into the display element layer DPL including the light emitting element LD.

Next, referring to FIG. 10, the base layer C_SUB may be provided on the rear surface SF1 of the substrate SUB.

The base layer C_SUB is a support member supporting the substrate SUB, and may have the same configuration as the base layer C_SUB described with reference to FIGS. 7A to 7K.

The base layer C_SUB may include the opening OPN in which an area corresponding to the light emitting element LD located on the surface SF2 of the substrate SUB is opened. The opening OPN of the base layer C_SUB may be the emission area EMA in which light is emitted from the pixel PXL.

The light shielding pattern LBP may be provided and/or formed on the base layer C_SUB.

The light shielding pattern LBP may include a light shielding material that prevents or reduces instances of light leaking between the pixel PXL and pixels adjacent thereto. In this case, the light shielding pattern LBP may have a black matrix pattern. The light shielding pattern LBP may prevent or reduce instances of colors of light emitted from adjacent pixels PXL being mixed. The light shielding pattern LBP may be provided in an area other than the emission area EMA in which light is emitted in the pixel area PXA where the pixel PXL is provided.

The optical conversion pattern layer LCP may be provided and/or formed in the opening OPN.

The optical conversion pattern layer LCP may include a color conversion layer CCL and a color filter CF. The color conversion layer CCL may include color conversion particles QD.

The insulating layer INS may be provided on the optical conversion pattern layer LCP and the light shielding pattern LBP.

As described above, the display device in according to some example embodiments of the present disclosure may be configured such that the optical conversion pattern layer LCP is located on the rear surface SF1 of the substrate SUB to emit light having excellent color reproducibility through the optical conversion pattern layer LCP and thereby improve light emission efficiency.

Embodiments according to the present disclosure can provide a display device having improved reliability, by transferring a semiconductor structure transferred to a transfer base substrate onto a substrate and then arranging a first electrode and a second electrode on the semiconductor structure to implement a light emitting element, thereby preventing or reducing contact failure of the light emitting element.

Furthermore, embodiments according to the present disclosure can provide a method of fabricating the above-described display device.

The effects of the present disclosure are not limited by the foregoing, and other various effects are anticipated herein.

While various example embodiments have been described above, those skilled in the art will appreciate that various modifications, additions and substitutions are possible, without departing from the scope and spirit of embodiments according to the present disclosure.

Therefore, the embodiments disclosed in this specification are only for illustrative purposes rather than limiting the technical spirit of the present disclosure. The scope of embodiments according to the present disclosure must be defined by the accompanying claims, and their equivalents.

What is claimed is:

1. A display device, comprising:
    a substrate including a plurality of pixel areas each having an emission area; and
    a pixel provided in each of the pixel areas,
    wherein the pixel comprises:
    at least one light emitting element on a first surface of the substrate;
    a first insulating layer on the light emitting element;
    at least one transistor on the first insulating layer and electrically connected to the light emitting element;
    a second insulating layer on the transistor;
    a common electrode on the second insulating layer; and
    a pixel electrode on a third insulating layer of the common electrode and electrically connected to the transistor,
    wherein the light emitting element comprises a semiconductor structure on the substrate, and first and second electrodes on the semiconductor structure to be spaced apart from each other, and
    wherein the first insulating layer is interposed between the light emitting element and the transistor.

2. The display device according to claim 1,
    wherein the semiconductor structure comprises a first semiconductor layer, an active layer on the first semiconductor layer, and a second semiconductor layer on the active layer,
    wherein the first electrode is electrically connected to one of the first and second semiconductor layers, and
    wherein the second electrode is electrically connected to a remaining one of the first and second semiconductor layers.

3. The display device according to claim 2,
    wherein the first electrode is between the first semiconductor layer and the first insulating layer, from a cross-section view, and
    wherein the second electrode is positioned between the second semiconductor layer and the first insulating layer, from the cross-section view.

4. The display device according to claim 2, wherein the semiconductor structure comprises a mesa interface.

5. The display device according to claim 2, wherein the pixel further comprises:
    a contact line electrically connecting the pixel electrode and the transistor; and
    a bridge pattern electrically connecting the transistor and the first electrode.

6. The display device according to claim 5, wherein the contact line and the bridge pattern are on a same layer, and comprise a same material.

7. The display device according to claim 5, wherein the common electrode is on each of a coupling line and the bridge pattern with the second insulating layer being interposed therebetween.

8. The display device according to claim 7, wherein the common electrode is electrically connected to the second electrode.

9. The display device according to claim 8, wherein the pixel further comprises at least one pad electrode electrically spaced apart from the pixel electrode on the third insulating layer and electrically connected to the common electrode and the second electrode.

10. The display device according to claim 9, further comprising:
    an optical conversion pattern layer on a second surface of the substrate to correspond to the emission area; and
    a light shielding pattern on a second surface of the substrate to correspond to a periphery of the emission area.

11. The display device according to claim 10, wherein the light shielding pattern is a black matrix.

12. The display device according to claim 10, further comprising a base layer on the second surface of the substrate and having an opening corresponding to the emission area,
    wherein the optical conversion pattern layer is in the opening.

13. The display device according to claim 12, wherein the optical conversion pattern layer comprises:
    a color conversion layer on the second surface of the substrate in the opening and including color conversion particles; and
    a color filter pattern on the color conversion layer.

14. The display device according to claim 13, wherein the light shielding pattern is on the base layer and does not overlap the opening.

15. The display device according to claim 10, further comprising a dam structure on the second surface of the substrate and defining an opening that overlaps the light emitting element,
    wherein the optical conversion pattern layer is in the opening.

16. The display device according to claim 15, wherein the light shielding pattern is on the dam structure.

17. The display device according to claim 1, further comprising a reflective member between the light emitting element and the transistor, from a cross-section view.

* * * * *

UNITED STATES PATENT AND TRADEMARK OFFICE
CERTIFICATE OF CORRECTION

| | | |
|---|---|---|
| PATENT NO. | : 12,108,634 B2 | Page 1 of 1 |
| APPLICATION NO. | : 17/220621 | |
| DATED | : October 1, 2024 | |
| INVENTOR(S) | : Hyung II Jeon et al. | |

It is certified that error appears in the above-identified patent and that said Letters Patent is hereby corrected as shown below:

On the Title Page

Item (72), in Column 1, under "Inventors", Line 1, delete "II" and insert -- Il --.

Signed and Sealed this
Eleventh Day of March, 2025

Coke Morgan Stewart
*Acting Director of the United States Patent and Trademark Office*